(12) United States Patent
Shigemori

(10) Patent No.: US 7,652,540 B2
(45) Date of Patent: Jan. 26, 2010

(54) FINE CLOCK RESOLUTION DIGITAL PHASE LOCKED LOOP APPARATUS

(75) Inventor: Toshihiro Shigemori, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 101 days.

(21) Appl. No.: 11/905,936

(22) Filed: Oct. 5, 2007

(65) Prior Publication Data

US 2008/0068094 A1    Mar. 20, 2008

Related U.S. Application Data

(63) Continuation of application No. 11/354,183, filed on Feb. 15, 2006, now Pat. No. 7,298,216.

(30) Foreign Application Priority Data

Feb. 16, 2005    (JP)    .............................. 2005-038890

(51) Int. Cl.
  *H03L 7/091*    (2006.01)
(52) U.S. Cl. .............................. 331/1 A; 331/25; 331/45
(58) Field of Classification Search .................... 331/16, 331/1 A, 25
  See application file for complete search history.

(56) References Cited

U.S. PATENT DOCUMENTS

| | | | |
|---|---|---|---|
| 4,876,699 A | 10/1989 | Nelson | |
| 5,073,776 A | 12/1991 | Shigemori | |
| 5,222,057 A | 6/1993 | Suzuki et al. | |
| 5,235,576 A | 8/1993 | Shigemori | |
| 5,381,116 A | 1/1995 | Nuckolls et al. | |
| 5,420,543 A | 5/1995 | Lundberg et al. | |
| 5,438,601 A | 8/1995 | Maegawa et al. | |
| 5,576,664 A | 11/1996 | Herold et al. | |
| 6,061,313 A | 5/2000 | Shigemori | |
| 6,125,089 A | 9/2000 | Shigemori | |
| 6,345,018 B1 | 2/2002 | Maegawa et al. | |
| 6,400,673 B1 | 6/2002 | Shigemori | |
| 6,621,307 B1 | 9/2003 | Younis et al. | |
| 6,693,862 B1 | 2/2004 | Shigemori | |
| 6,859,425 B2 | 2/2005 | Maegawa et al. | |
| 2004/0146098 A1* | 7/2004 | Eliezer et al. ................ 375/227 | |

FOREIGN PATENT DOCUMENTS

EP    0 552 601    7/1993

\* cited by examiner

*Primary Examiner*—Joseph Chang
(74) *Attorney, Agent, or Firm*—Dickstein Shapiro LLP

(57) ABSTRACT

A digital phase locked loop apparatus includes an input signal time detecting device that detects a phase of an input signal with prescribed time resolution obtained by dividing a cycle of an operation clock generated by a clock generator at a prescribed time. An output clock generating device outputs output clock time data per the one cycle in accordance with frequency control data. The output clock time data has a value corresponding to a phase of a virtual output clock generated by dividing the operation clock in accordance with the time resolution. A phase difference detecting device detects a difference between phases of the input signal and the virtual output clock, and outputs a phase difference signal in accordance with the detection result. The frequency control device changes the frequency control data in accordance with the phase difference signal.

5 Claims, 43 Drawing Sheets

FIG. 10

| | | | | | | |
|---|---|---|---|---|---|---|
| CLOCK CYCLE NUMBER | 5 | 0 | 1 | 2 | 3 | 4 |
| FREQUENCY CONTROL DATA | -1 | -1 | -1 | -1 | -1 | -1 |
| STATE St | 4 | 0 | 8 | 7 | 6 | 5 |
| STATE StN | 3 | 8 | 7 | 6 | 5 | 4 |
| VIRTUAL OUTPUT CLOCK PHASE | — | — | — | — | — | — |

(a)

| | | | | | | |
|---|---|---|---|---|---|---|
| CLOCK CYCLE NUMBER | 6 | 7 | 8 | 9 | 10 | 11 |
| FREQUENCY CONTROL DATA | -1 | -1 | -1 | -1 | -1 | -1 |
| STATE St | 3 | 2 | 1 | 0 | 8 | 7 |
| STATE StN | 2 | 1 | 0 | 8 | 7 | 6 |
| VIRTUAL OUTPUT CLOCK PHASE | — | — | — | — | — | — |

(b)

| | | | | | | | |
|---|---|---|---|---|---|---|---|
| CLOCK CYCLE NUMBER | 12 | 13 | 14 | 15 | 16 | 17 | 18 |
| FREQUENCY CONTROL DATA | -1 | 0 | 0 | 0 | 0 | 0 | 0 |
| STATE St | 6 | 5 | 5 | 5 | 5 | 5 | 5 |
| STATE StN | 5 | 5 | 5 | 5 | 5 | 5 | 5 |
| VIRTUAL OUTPUT CLOCK PHASE | — | — | — | — | — | — | — |

(c)

| | | | | | | | |
|---|---|---|---|---|---|---|---|
| CLOCK CYCLE NUMBER | 19 | 20 | 21 | 22 | 23 | 24 | 25 |
| FREQUENCY CONTROL DATA | 0 | 0 | 1 | 1 | 1 | 1 | 1 |
| STATE St | 5 | 5 | 5 | 6 | 7 | 9 | 2 |
| STATE StN | 5 | 5 | 6 | 7 | 9 | 2 | 3 |
| VIRTUAL OUTPUT CLOCK PHASE | — | — | — | — | — | — | — |

(d)

| | | | | | | | |
|---|---|---|---|---|---|---|---|
| CLOCK CYCLE NUMBER | 26 | 27 | 28 | 29 | 30 | 31 | 32 |
| FREQUENCY CONTROL DATA | 1 | 1 | 1 | 1 | 1 | 1 | 1 |
| STATE St | 3 | 4 | 5 | 6 | 7 | 9 | 2 |
| STATE StN | 4 | 5 | 6 | 7 | 9 | 2 | 3 |
| VIRTUAL OUTPUT CLOCK PHASE | — | — | — | — | — | — | — |

| CLOCK CYCLE NUMBER | 0 | 1 | 2 | 3 | 4 |
|---|---|---|---|---|---|
| FREQUENCY CONTROL DATA (0-36) | 23 | 23 | 23 | 23 | 23 |
| STATE St0 | 0 | 12 | 0 | 0 | 0 |
| STATE StN | 12 | 0 | 11 | 11 | 10 |
| VIRTUAL OUTPUT CLOCK PHASE | -1 | -1 | -1 | -1 | -1 |

(b)

| 5 | 6 | 7 | 8 | 9 | 10 | 11 |
|---|---|---|---|---|---|---|
| 23 | 23 | 23 | 23 | 23 | 23 | 23 |
| 10 | 0 | 9 | 0 | 8 | 0 | 7 |
| 0 | 9 | 0 | 8 | 0 | 7 | 0 |
| -1 | -1 | -1 | -1 | -1 | -1 | -1 |

(c)

| 12 | 13 | 14 | 15 | 16 | 17 | 18 |
|---|---|---|---|---|---|---|
| 23 | 23 | 23 | 23 | 23 | 23 | 23 |
| 0 | 6 | 0 | 5 | 0 | 4 | 0 |
| 6 | 0 | 5 | 0 | 4 | 0 | 3 |
| -1 | -1 | -1 | -1 | -1 | -1 | -1 |

(d)

| 19 | 20 | 21 | 22 | 23 | 24 | 25 |
|---|---|---|---|---|---|---|
| 23 | 23 | 23 | 23 | 23 | 23 | 23 |
| 3 | 0 | 2 | 0 | 1 | 0 | 0 |
| 0 | 2 | 0 | 1 | 0 | 0 | 0 |
| -1 | -1 | -1 | -1 | -1 | -1 | 12 |

(e)

| 26 | 27 | 28 | 29 |
|---|---|---|---|
| 23 | 23 | 23 | 23 |
| 12 | 0 | 11 | 0 |
| 0 | 11 | 0 | 10 |
| -1 | -1 | -1 | -1 |

| CLOCK CYCLE NUMBER | 0 | 1 | 2 | 3 | 4 |
|---|---|---|---|---|---|
| FREQUENCY CONTROL DATA (0–36) | 24 | 24 | 24 | 24 | 24 |
| STATE St0 | 0 | 12 | 0 | 12 | 0 |
| STATE StN | 12 | 0 | 12 | 0 | 12 |
| VIRTUAL OUTPUT CLOCK PHASE | — | — | — | — | — |

(b)

| 5 | 6 | 7 | 8 | 9 | 10 | 11 |
|---|---|---|---|---|---|---|
| 24 | 24 | 24 | 24 | 24 | 24 | 24 |
| 12 | 0 | 12 | 0 | 12 | 0 | 12 |
| 0 | 12 | 0 | 12 | 0 | 12 | 0 |
| — | — | — | — | — | — | — |

(c)

| 12 | 13 | 14 | 15 | 16 | 17 | 18 |
|---|---|---|---|---|---|---|
| 24 | 24 | 24 | 24 | 24 | 24 | 24 |
| 0 | 0 | 0 | 0 | 0 | 0 | 0 |
| 12 | 12 | 12 | 12 | 12 | 12 | 12 |
| — | — | — | — | — | — | — |

(d)

| 19 | 20 | 21 | 22 | 23 | 24 | 25 |
|---|---|---|---|---|---|---|
| 24 | 24 | 24 | 24 | 24 | 24 | 24 |
| 12 | 0 | 12 | 0 | 12 | 0 | 12 |
| 0 | 12 | 0 | 12 | 0 | 12 | 0 |
| — | — | — | — | — | — | — |

(e)

| 26 | 27 | 28 | 29 |
|---|---|---|---|
| 24 | 24 | 24 | 24 |
| 12 | 0 | 12 | 0 |
| 0 | 12 | 0 | 12 |
| — | — | — | — |

| CLOCK CYCLE NUMBER | 0 | 1 | 2 | 3 | 4 |
|---|---|---|---|---|---|
| FREQUENCY CONTROL DATA (0-36) | 25 | 25 | 25 | 25 | 25 |
| STATE St0 | 0 | 12 | 1 | 0 | 2 |
| STATE StN | 12 | 1 | 0 | 2 | 0 |
| VIRTUAL OUTPUT CLOCK PHASE | -1 | -1 | -1 | -1 | -1 |

(b)

| CLOCK CYCLE NUMBER | 5 | 6 | 7 | 8 | 9 | 10 | 11 |
|---|---|---|---|---|---|---|---|
| FREQUENCY CONTROL DATA (0-36) | 25 | 25 | 25 | 25 | 25 | 25 | 25 |
| STATE St0 | 0 | 3 | 0 | 4 | 0 | 5 | 0 |
| STATE StN | 3 | 0 | 4 | 0 | 5 | 0 | 6 |
| VIRTUAL OUTPUT CLOCK PHASE | -1 | -1 | -1 | -1 | -1 | -1 | -1 |

(c)

| CLOCK CYCLE NUMBER | 12 | 13 | 14 | 15 | 16 | 17 | 18 |
|---|---|---|---|---|---|---|---|
| FREQUENCY CONTROL DATA (0-36) | 25 | 25 | 25 | 25 | 25 | 25 | 25 |
| STATE St0 | 6 | 0 | 7 | 0 | 8 | 0 | 9 |
| STATE StN | 0 | 7 | 0 | 8 | 0 | 9 | 0 |
| VIRTUAL OUTPUT CLOCK PHASE | 0 | 0 | 0 | 0 | 0 | 0 | 0 |

(d)

| CLOCK CYCLE NUMBER | 19 | 20 | 21 | 22 | 23 | 24 | 25 |
|---|---|---|---|---|---|---|---|
| FREQUENCY CONTROL DATA (0-36) | 25 | 25 | 25 | 25 | 25 | 25 | 25 |
| STATE St0 | 0 | 10 | 0 | 11 | 0 | 12 | 1 |
| STATE StN | 10 | 0 | 11 | 0 | 12 | 1 | 0 |
| VIRTUAL OUTPUT CLOCK PHASE | 0 | 0 | 0 | 0 | 0 | 0 | 1 |

(e)

| CLOCK CYCLE NUMBER | 26 | 27 | 28 | 29 |
|---|---|---|---|---|
| FREQUENCY CONTROL DATA (0-36) | 25 | 25 | 25 | 25 |
| STATE St0 | 0 | 2 | 0 | 3 |
| STATE StN | 2 | 0 | 3 | 0 |
| VIRTUAL OUTPUT CLOCK PHASE | -1 | -1 | -1 | -1 |

| CLOCK CYCLE NUMBER | 0 | 1 | 2 | 3 | 4 | 5 | 6 |
|---|---|---|---|---|---|---|---|
| FREQUENCY CONTROL DATA (0-36) | 0 | 0 | 0 | 0 | 0 | 0 | 0 |
| STATE St0 | 0 | 12 | 0 | 0 | 0 | 12 | 0 |
| STATE StN | 12 | 0 | 0 | 0 | 12 | 0 | 0 |
| VIRTUAL OUTPUT CLOCK PHASE | — | — | — | — | — | — | — |

(b)

| CLOCK CYCLE NUMBER | 7 | 8 | 9 |
|---|---|---|---|
| FREQUENCY CONTROL DATA (0-36) | 0 | 0 | 0 |
| STATE St0 | 0 | 0 | 12 |
| STATE StN | 0 | 12 | 0 |
| VIRTUAL OUTPUT CLOCK PHASE | — | — | — |

| CLOCK CYCLE NUMBER | 0 | 1 | 2 | 3 | 4 | 5 | 6 |
|---|---|---|---|---|---|---|---|
| FREQUENCY CONTROL DATA (0-36) | 36 | 36 | 36 | 36 | 36 | 36 | 36 |
| STATE St0 | 0 | 12 | 12 | 12 | 12 | 12 | 12 |
| STATE StN | 12 | 12 | 12 | 12 | 12 | 12 | 12 |
| VIRTUAL OUTPUT CLOCK PHASE | — | — | — | — | — | — | — |

(b)

| CLOCK CYCLE NUMBER | 7 | 8 | 9 |
|---|---|---|---|
| FREQUENCY CONTROL DATA (0-36) | 36 | 36 | 36 |
| STATE St0 | 12 | 12 | 12 |
| STATE StN | 12 | 12 | 12 |
| VIRTUAL OUTPUT CLOCK PHASE | — | — | — |

| CLOCK CYCLE NUMBER | FREQUENCY CONTROL DATA (S4) (1-32) | Mpy ||||||||
|---|---|---|---|---|---|---|---|---|---|
| | | 1 | 2 | 3 | 4 | 5 | 6 | 7 | 8 |
| 0 | 15 | 15 | 30 | 45 | 60 | 75 | 90 | 105 | 120 |
| 1 | 15 | 15 | 30 | 45 | 60 | 75 | 90 | 105 | 120 |
| 2 | 15 | 15 | 30 | 45 | 60 | 75 | 90 | 105 | 120 |
| 3 | 15 | 15 | 30 | 45 | 60 | 75 | 90 | 105 | 120 |
| 4 | 15 | 15 | 30 | 45 | 60 | 75 | 90 | 105 | 120 |
| 5 | 15 | 15 | 30 | 45 | 60 | 75 | 90 | 105 | 120 |
| 6 | 15 | 15 | 30 | 45 | 60 | 75 | 90 | 105 | 120 |
| 7 | 15 | 15 | 30 | 45 | 60 | 75 | 90 | 105 | 120 |
| 8 | 15 | 15 | 30 | 45 | 60 | 75 | 90 | 105 | 120 |
| 9 | 15 | 15 | 30 | 45 | 60 | 75 | 90 | 105 | 120 |
| 10 | 15 | 15 | 30 | 45 | 60 | 75 | 90 | 105 | 120 |
| 11 | 15 | 15 | 30 | 45 | 60 | 75 | 90 | 105 | 120 |
| 12 | 15 | 15 | 30 | 45 | 60 | 75 | 90 | 105 | 120 |
| 13 | 15 | 15 | 30 | 45 | 60 | 75 | 90 | 105 | 120 |
| 14 | 15 | 15 | 30 | 45 | 60 | 75 | 90 | 105 | 120 |
| 15 | 15 | 15 | 30 | 45 | 60 | 75 | 90 | 105 | 120 |
| 16 | 15 | 15 | 30 | 45 | 60 | 75 | 90 | 105 | 120 |
| 17 | 15 | 15 | 30 | 45 | 60 | 75 | 90 | 105 | 120 |
| 18 | 15 | 15 | 30 | 45 | 60 | 75 | 90 | 105 | 120 |
| 19 | 15 | 15 | 30 | 45 | 60 | 75 | 90 | 105 | 120 |
| 20 | 15 | 15 | 30 | 45 | 60 | 75 | 90 | 105 | 120 |
| 21 | 15 | 15 | 30 | 45 | 60 | 75 | 90 | 105 | 120 |
| 22 | 15 | 15 | 30 | 45 | 60 | 75 | 90 | 105 | 120 |
| 23 | 15 | 15 | 30 | 45 | 60 | 75 | 90 | 105 | 120 |
| 24 | 15 | 15 | 30 | 45 | 60 | 75 | 90 | 105 | 120 |
| 25 | 15 | 15 | 30 | 45 | 60 | 75 | 90 | 105 | 120 |
| 26 | 15 | 15 | 30 | 45 | 60 | 75 | 90 | 105 | 120 |
| 27 | 15 | 15 | 30 | 45 | 60 | 75 | 90 | 105 | 120 |
| 28 | 15 | 15 | 30 | 45 | 60 | 75 | 90 | 105 | 120 |
| 29 | 15 | 15 | 30 | 45 | 60 | 75 | 90 | 105 | 120 |
| 30 | 15 | 15 | 30 | 45 | 60 | 75 | 90 | 105 | 120 |

FIG. 18B

| Add | | | | | | | | FbDat | OUTPUT CLOCK TIME DATA 1 (S5) | | | | | | | |
|---|---|---|---|---|---|---|---|---|---|---|---|---|---|---|---|---|
| 1 | 2 | 3 | 4 | 5 | 6 | 7 | 8 | | 1 | 2 | 3 | 4 | 5 | 6 | 7 | 8 |
| | | | | | | | 64 | | | | | | | | | |
| 79 | 94 | 109 | 124 | 139 | 154 | 169 | 184 | 64 | 0 | 0 | 0 | 0 | 0 | 0 | 0 | 0 |
| 199 | 214 | 229 | 244 | 259 | 274 | 289 | 304 | 184 | 0 | 0 | 0 | 0 | 1 | 0 | 0 | 0 |
| 63 | 78 | 93 | 108 | 123 | 138 | 153 | 168 | 48 | 0 | 0 | 0 | 0 | 0 | 0 | 0 | 0 |
| 183 | 198 | 213 | 228 | 243 | 258 | 273 | 288 | 168 | 0 | 0 | 0 | 0 | 0 | 1 | 0 | 0 |
| 47 | 62 | 77 | 92 | 107 | 122 | 137 | 152 | 32 | 0 | 0 | 0 | 0 | 0 | 0 | 0 | 0 |
| 167 | 182 | 197 | 212 | 227 | 242 | 257 | 272 | 152 | 0 | 0 | 0 | 0 | 0 | 0 | 1 | 0 |
| 31 | 46 | 61 | 76 | 91 | 106 | 121 | 136 | 16 | 0 | 0 | 0 | 0 | 0 | 0 | 0 | 0 |
| 151 | 166 | 181 | 196 | 211 | 226 | 241 | 256 | 136 | 0 | 0 | 0 | 0 | 0 | 0 | 0 | 1 |
| 15 | 30 | 45 | 60 | 75 | 90 | 105 | 120 | 0 | 0 | 0 | 0 | 0 | 0 | 0 | 0 | 0 |
| 135 | 150 | 165 | 180 | 195 | 210 | 225 | 240 | 120 | 0 | 0 | 0 | 0 | 0 | 0 | 0 | 0 |
| 255 | 270 | 285 | 300 | 315 | 330 | 345 | 360 | 240 | 0 | 1 | 0 | 0 | 0 | 0 | 0 | 0 |
| 119 | 134 | 149 | 164 | 179 | 194 | 209 | 224 | 104 | 0 | 0 | 0 | 0 | 0 | 0 | 0 | 0 |
| 239 | 254 | 269 | 284 | 299 | 314 | 329 | 344 | 224 | 0 | 0 | 1 | 0 | 0 | 0 | 0 | 0 |
| 103 | 118 | 133 | 148 | 163 | 178 | 193 | 208 | 88 | 0 | 0 | 0 | 0 | 0 | 0 | 0 | 0 |
| 223 | 238 | 253 | 268 | 283 | 298 | 313 | 328 | 208 | 0 | 0 | 0 | 1 | 0 | 0 | 0 | 0 |
| 87 | 102 | 117 | 132 | 147 | 162 | 177 | 192 | 72 | 0 | 0 | 0 | 0 | 0 | 0 | 0 | 0 |
| 207 | 222 | 237 | 252 | 267 | 282 | 297 | 312 | 192 | 0 | 0 | 0 | 0 | 1 | 0 | 0 | 0 |
| 71 | 86 | 101 | 116 | 131 | 146 | 161 | 176 | 56 | 0 | 0 | 0 | 0 | 0 | 0 | 0 | 0 |
| 191 | 206 | 221 | 236 | 251 | 266 | 281 | 296 | 176 | 0 | 0 | 0 | 0 | 0 | 1 | 0 | 0 |
| 55 | 70 | 85 | 100 | 115 | 130 | 145 | 160 | 40 | 0 | 0 | 0 | 0 | 0 | 0 | 0 | 0 |
| 175 | 190 | 205 | 220 | 235 | 250 | 265 | 280 | 160 | 0 | 0 | 0 | 0 | 0 | 0 | 1 | 0 |
| 39 | 54 | 69 | 84 | 99 | 114 | 129 | 144 | 24 | 0 | 0 | 0 | 0 | 0 | 0 | 0 | 0 |
| 159 | 174 | 189 | 204 | 219 | 234 | 249 | 264 | 144 | 0 | 0 | 0 | 0 | 0 | 0 | 0 | 1 |
| 23 | 38 | 53 | 68 | 83 | 98 | 113 | 128 | 8 | 0 | 0 | 0 | 0 | 0 | 0 | 0 | 0 |
| 143 | 158 | 173 | 188 | 203 | 218 | 233 | 248 | 128 | 0 | 0 | 0 | 0 | 0 | 0 | 0 | 0 |
| 263 | 278 | 293 | 308 | 323 | 338 | 353 | 368 | 248 | 1 | 0 | 0 | 0 | 0 | 0 | 0 | 0 |
| 127 | 142 | 157 | 172 | 187 | 202 | 217 | 232 | 112 | 0 | 0 | 0 | 0 | 0 | 0 | 0 | 0 |
| 247 | 262 | 277 | 292 | 307 | 322 | 337 | 352 | 232 | 0 | 1 | 0 | 0 | 0 | 0 | 0 | 0 |
| 111 | 126 | 141 | 156 | 171 | 186 | 201 | 216 | 96 | 0 | 0 | 0 | 0 | 0 | 0 | 0 | 0 |
| 231 | 246 | 261 | 276 | 291 | 306 | 321 | 336 | 216 | 0 | 0 | 1 | 0 | 0 | 0 | 0 | 0 |
| 95 | 110 | 125 | 140 | 155 | 170 | 185 | 200 | 80 | 0 | 0 | 0 | 0 | 0 | 0 | 0 | 0 |

| CLOCK CYCLE NUMBER | FREQUENCY CONTROL DATA (S4) (1-32) | Mpy | | | | | | | |
|---|---|---|---|---|---|---|---|---|---|
| | | 1 | 2 | 3 | 4 | 5 | 6 | 7 | 8 |
| 0 | 16 | 16 | 32 | 48 | 64 | 80 | 96 | 112 | 128 |
| 1 | 16 | 16 | 32 | 48 | 64 | 80 | 96 | 112 | 128 |
| 2 | 16 | 16 | 32 | 48 | 64 | 80 | 96 | 112 | 128 |
| 3 | 16 | 16 | 32 | 48 | 64 | 80 | 96 | 112 | 128 |
| 4 | 16 | 16 | 32 | 48 | 64 | 80 | 96 | 112 | 128 |
| 5 | 16 | 16 | 32 | 48 | 64 | 80 | 96 | 112 | 128 |
| 6 | 16 | 16 | 32 | 48 | 64 | 80 | 96 | 112 | 128 |
| 7 | 16 | 16 | 32 | 48 | 64 | 80 | 96 | 112 | 128 |
| 8 | 16 | 16 | 32 | 48 | 64 | 80 | 96 | 112 | 128 |
| 9 | 16 | 16 | 32 | 48 | 64 | 80 | 96 | 112 | 128 |
| 10 | 16 | 16 | 32 | 48 | 64 | 80 | 96 | 112 | 128 |
| 11 | 16 | 16 | 32 | 48 | 64 | 80 | 96 | 112 | 128 |
| 12 | 16 | 16 | 32 | 48 | 64 | 80 | 96 | 112 | 128 |
| 13 | 16 | 16 | 32 | 48 | 64 | 80 | 96 | 112 | 128 |
| 14 | 16 | 16 | 32 | 48 | 64 | 80 | 96 | 112 | 128 |
| 15 | 16 | 16 | 32 | 48 | 64 | 80 | 96 | 112 | 128 |
| 16 | 16 | 16 | 32 | 48 | 64 | 80 | 96 | 112 | 128 |
| 17 | 16 | 16 | 32 | 48 | 64 | 80 | 96 | 112 | 128 |
| 18 | 16 | 16 | 32 | 48 | 64 | 80 | 96 | 112 | 128 |
| 19 | 16 | 16 | 32 | 48 | 64 | 80 | 96 | 112 | 128 |
| 20 | 16 | 16 | 32 | 48 | 64 | 80 | 96 | 112 | 128 |
| 21 | 16 | 16 | 32 | 48 | 64 | 80 | 96 | 112 | 128 |
| 22 | 16 | 16 | 32 | 48 | 64 | 80 | 96 | 112 | 128 |
| 23 | 16 | 16 | 32 | 48 | 64 | 80 | 96 | 112 | 128 |
| 24 | 16 | 16 | 32 | 48 | 64 | 80 | 96 | 112 | 128 |
| 25 | 16 | 16 | 32 | 48 | 64 | 80 | 96 | 112 | 128 |
| 26 | 16 | 16 | 32 | 48 | 64 | 80 | 96 | 112 | 128 |
| 27 | 16 | 16 | 32 | 48 | 64 | 80 | 96 | 112 | 128 |
| 28 | 16 | 16 | 32 | 48 | 64 | 80 | 96 | 112 | 128 |
| 29 | 16 | 16 | 32 | 48 | 64 | 80 | 96 | 112 | 128 |
| 30 | 16 | 16 | 32 | 48 | 64 | 80 | 96 | 112 | 128 |

FIG. 19B

| Add | | | | | | | | FbDat | OUTPUT CLOCK TIME DATA 1 (S5) | | | | | | | |
|---|---|---|---|---|---|---|---|---|---|---|---|---|---|---|---|---|
| 1 | 2 | 3 | 4 | 5 | 6 | 7 | 8 | | 1 | 2 | 3 | 4 | 5 | 6 | 7 | 8 |
| | | | | | | | | 64 | | | | | | | | |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |
| 208 | 224 | 240 | 256 | 272 | 288 | 304 | 320 | 192 | 0 | 0 | 0 | 1 | 0 | 0 | 0 | 0 |
| 80 | 96 | 112 | 128 | 144 | 160 | 176 | 192 | 64 | 0 | 0 | 0 | 0 | 0 | 0 | 0 | 0 |

| CLOCK CYCLE NUMBER | FREQUENCY CONTROL DATA (S4) (1-32) | Mpy | | | | | | | |
|---|---|---|---|---|---|---|---|---|---|
| | | 1 | 2 | 3 | 4 | 5 | 6 | 7 | 8 |
| 0 | 17 | 17 | 34 | 51 | 68 | 85 | 102 | 119 | 136 |
| 1 | 17 | 17 | 34 | 51 | 68 | 85 | 102 | 119 | 136 |
| 2 | 17 | 17 | 34 | 51 | 68 | 85 | 102 | 119 | 136 |
| 3 | 17 | 17 | 34 | 51 | 68 | 85 | 102 | 119 | 136 |
| 4 | 17 | 17 | 34 | 51 | 68 | 85 | 102 | 119 | 136 |
| 5 | 17 | 17 | 34 | 51 | 68 | 85 | 102 | 119 | 136 |
| 6 | 17 | 17 | 34 | 51 | 68 | 85 | 102 | 119 | 136 |
| 7 | 17 | 17 | 34 | 51 | 68 | 85 | 102 | 119 | 136 |
| 8 | 17 | 17 | 34 | 51 | 68 | 85 | 102 | 119 | 136 |
| 9 | 17 | 17 | 34 | 51 | 68 | 85 | 102 | 119 | 136 |
| 10 | 17 | 17 | 34 | 51 | 68 | 85 | 102 | 119 | 136 |
| 11 | 17 | 17 | 34 | 51 | 68 | 85 | 102 | 119 | 136 |
| 12 | 17 | 17 | 34 | 51 | 68 | 85 | 102 | 119 | 136 |
| 13 | 17 | 17 | 34 | 51 | 68 | 85 | 102 | 119 | 136 |
| 14 | 17 | 17 | 34 | 51 | 68 | 85 | 102 | 119 | 136 |
| 17 | 17 | 17 | 34 | 51 | 68 | 85 | 102 | 119 | 136 |
| 16 | 17 | 17 | 34 | 51 | 68 | 85 | 102 | 119 | 136 |
| 17 | 17 | 17 | 34 | 51 | 68 | 85 | 102 | 119 | 136 |
| 18 | 17 | 17 | 34 | 51 | 68 | 85 | 102 | 119 | 136 |
| 19 | 17 | 17 | 34 | 51 | 68 | 85 | 102 | 119 | 136 |
| 20 | 17 | 17 | 34 | 51 | 68 | 85 | 102 | 119 | 136 |
| 21 | 17 | 17 | 34 | 51 | 68 | 85 | 102 | 119 | 136 |
| 22 | 17 | 17 | 34 | 51 | 68 | 85 | 102 | 119 | 136 |
| 23 | 17 | 17 | 34 | 51 | 68 | 85 | 102 | 119 | 136 |
| 24 | 17 | 17 | 34 | 51 | 68 | 85 | 102 | 119 | 136 |
| 25 | 17 | 17 | 34 | 51 | 68 | 85 | 102 | 119 | 136 |
| 26 | 17 | 17 | 34 | 51 | 68 | 85 | 102 | 119 | 136 |
| 27 | 17 | 17 | 34 | 51 | 68 | 85 | 102 | 119 | 136 |
| 28 | 17 | 17 | 34 | 51 | 68 | 85 | 102 | 119 | 136 |
| 29 | 17 | 17 | 34 | 51 | 68 | 85 | 102 | 119 | 136 |
| 30 | 17 | 17 | 34 | 51 | 68 | 85 | 102 | 119 | 136 |

FIG. 20B

| Add | | | | | | | | FbDat | OUTPUT CLOCK TIME DATA 1 (S5) | | | | | | | |
|---|---|---|---|---|---|---|---|---|---|---|---|---|---|---|---|---|
| 1 | 2 | 3 | 4 | 5 | 6 | 7 | 8 | | 1 | 2 | 3 | 4 | 5 | 6 | 7 | 8 |
| | | | | | | | 64 | | | | | | | | | |
| 81 | 98 | 115 | 132 | 149 | 166 | 183 | 200 | 64 | 0 | 0 | 0 | 0 | 0 | 0 | 0 | 0 |
| 217 | 234 | 251 | 268 | 285 | 302 | 319 | 336 | 200 | 0 | 0 | 0 | 1 | 0 | 0 | 0 | 0 |
| 97 | 114 | 131 | 148 | 165 | 182 | 199 | 216 | 80 | 0 | 0 | 0 | 0 | 0 | 0 | 0 | 0 |
| 233 | 250 | 267 | 284 | 301 | 318 | 335 | 352 | 216 | 0 | 0 | 1 | 0 | 0 | 0 | 0 | 0 |
| 113 | 130 | 147 | 164 | 181 | 198 | 215 | 232 | 96 | 0 | 0 | 0 | 0 | 0 | 0 | 0 | 0 |
| 249 | 266 | 283 | 300 | 317 | 334 | 351 | 368 | 232 | 0 | 1 | 0 | 0 | 0 | 0 | 0 | 0 |
| 129 | 146 | 163 | 180 | 197 | 214 | 231 | 248 | 112 | 0 | 0 | 0 | 0 | 0 | 0 | 0 | 0 |
| 265 | 282 | 299 | 316 | 333 | 350 | 367 | 384 | 248 | 1 | 0 | 0 | 0 | 0 | 0 | 0 | 0 |
| 145 | 162 | 179 | 196 | 213 | 230 | 247 | 264 | 128 | 0 | 0 | 0 | 0 | 0 | 0 | 0 | 1 |
| 25 | 42 | 59 | 76 | 93 | 110 | 127 | 144 | 8 | 0 | 0 | 0 | 0 | 0 | 0 | 0 | 0 |
| 161 | 178 | 195 | 212 | 229 | 246 | 263 | 280 | 144 | 0 | 0 | 0 | 0 | 0 | 0 | 1 | 0 |
| 41 | 58 | 75 | 92 | 109 | 126 | 143 | 160 | 24 | 0 | 0 | 0 | 0 | 0 | 0 | 0 | 0 |
| 177 | 194 | 211 | 228 | 245 | 262 | 279 | 296 | 160 | 0 | 0 | 0 | 0 | 0 | 1 | 0 | 0 |
| 57 | 74 | 91 | 108 | 125 | 142 | 159 | 176 | 40 | 0 | 0 | 0 | 0 | 0 | 0 | 0 | 0 |
| 193 | 210 | 227 | 244 | 261 | 278 | 295 | 312 | 176 | 0 | 0 | 0 | 0 | 1 | 0 | 0 | 0 |
| 73 | 90 | 107 | 124 | 141 | 158 | 175 | 192 | 56 | 0 | 0 | 0 | 0 | 0 | 0 | 0 | 0 |
| 209 | 226 | 243 | 260 | 277 | 294 | 311 | 328 | 192 | 0 | 0 | 0 | 1 | 0 | 0 | 0 | 0 |
| 89 | 106 | 123 | 140 | 157 | 174 | 191 | 208 | 72 | 0 | 0 | 0 | 0 | 0 | 0 | 0 | 0 |
| 225 | 242 | 259 | 276 | 293 | 310 | 327 | 344 | 208 | 0 | 0 | 1 | 0 | 0 | 0 | 0 | 0 |
| 105 | 122 | 139 | 156 | 173 | 190 | 207 | 224 | 88 | 0 | 0 | 0 | 0 | 0 | 0 | 0 | 0 |
| 241 | 258 | 275 | 292 | 309 | 326 | 343 | 360 | 224 | 0 | 1 | 0 | 0 | 0 | 0 | 0 | 0 |
| 121 | 138 | 155 | 172 | 189 | 206 | 223 | 240 | 104 | 0 | 0 | 0 | 0 | 0 | 0 | 0 | 0 |
| 257 | 274 | 291 | 308 | 325 | 342 | 359 | 376 | 240 | 1 | 0 | 0 | 0 | 0 | 0 | 0 | 0 |
| 137 | 154 | 171 | 188 | 205 | 222 | 239 | 256 | 120 | 0 | 0 | 0 | 0 | 0 | 0 | 0 | 1 |
| 17 | 34 | 51 | 68 | 85 | 102 | 119 | 136 | 0 | 0 | 0 | 0 | 0 | 0 | 0 | 0 | 0 |
| 153 | 170 | 187 | 204 | 221 | 238 | 255 | 272 | 136 | 0 | 0 | 0 | 0 | 0 | 0 | 0 | 1 |
| 33 | 50 | 67 | 84 | 101 | 118 | 135 | 152 | 16 | 0 | 0 | 0 | 0 | 0 | 0 | 0 | 0 |
| 169 | 186 | 203 | 220 | 237 | 254 | 271 | 288 | 152 | 0 | 0 | 0 | 0 | 0 | 0 | 1 | 0 |
| 49 | 66 | 83 | 100 | 117 | 134 | 151 | 168 | 32 | 0 | 0 | 0 | 0 | 0 | 0 | 0 | 0 |
| 185 | 202 | 219 | 236 | 253 | 270 | 287 | 304 | 168 | 0 | 0 | 0 | 0 | 0 | 1 | 0 | 0 |
| 65 | 82 | 99 | 116 | 133 | 150 | 167 | 184 | 48 | 0 | 0 | 0 | 0 | 0 | 0 | 0 | 0 |

| FIG. 21A |
|----------|
| FIG. 21B |

| CLOCK CYCLE NUMBER | FREQUENCY CONTROL DATA (S4) (1-32) | Mpy | | | | | | | |
|---|---|---|---|---|---|---|---|---|---|
| | | 1 | 2 | 3 | 4 | 5 | 6 | 7 | 8 |
| 0 | 8 | 8 | 16 | 24 | 32 | 40 | 48 | 56 | 64 |
| 1 | 8 | 8 | 16 | 24 | 32 | 40 | 48 | 56 | 64 |
| 2 | 8 | 8 | 16 | 24 | 32 | 40 | 48 | 56 | 64 |
| 3 | 8 | 8 | 16 | 24 | 32 | 40 | 48 | 56 | 64 |
| 4 | 8 | 8 | 16 | 24 | 32 | 40 | 48 | 56 | 64 |
| 5 | 8 | 8 | 16 | 24 | 32 | 40 | 48 | 56 | 64 |
| 6 | 8 | 8 | 16 | 24 | 32 | 40 | 48 | 56 | 64 |
| 7 | 8 | 8 | 16 | 24 | 32 | 40 | 48 | 56 | 64 |
| 8 | 8 | 8 | 16 | 24 | 32 | 40 | 48 | 56 | 64 |
| 9 | 8 | 8 | 16 | 24 | 32 | 40 | 48 | 56 | 64 |
| 10 | 8 | 8 | 16 | 24 | 32 | 40 | 48 | 56 | 64 |
| 11 | 8 | 8 | 16 | 24 | 32 | 40 | 48 | 56 | 64 |
| 12 | 8 | 8 | 16 | 24 | 32 | 40 | 48 | 56 | 64 |
| 13 | 8 | 8 | 16 | 24 | 32 | 40 | 48 | 56 | 64 |
| 14 | 8 | 8 | 16 | 24 | 32 | 40 | 48 | 56 | 64 |
| 15 | 8 | 8 | 16 | 24 | 32 | 40 | 48 | 56 | 64 |
| 16 | 8 | 8 | 16 | 24 | 32 | 40 | 48 | 56 | 64 |
| 17 | 8 | 8 | 16 | 24 | 32 | 40 | 48 | 56 | 64 |
| 18 | 8 | 8 | 16 | 24 | 32 | 40 | 48 | 56 | 64 |
| 19 | 8 | 8 | 16 | 24 | 32 | 40 | 48 | 56 | 64 |
| 20 | 8 | 8 | 16 | 24 | 32 | 40 | 48 | 56 | 64 |
| 21 | 8 | 8 | 16 | 24 | 32 | 40 | 48 | 56 | 64 |
| 22 | 8 | 8 | 16 | 24 | 32 | 40 | 48 | 56 | 64 |
| 23 | 8 | 8 | 16 | 24 | 32 | 40 | 48 | 56 | 64 |
| 24 | 8 | 8 | 16 | 24 | 32 | 40 | 48 | 56 | 64 |
| 25 | 8 | 8 | 16 | 24 | 32 | 40 | 48 | 56 | 64 |
| 26 | 8 | 8 | 16 | 24 | 32 | 40 | 48 | 56 | 64 |
| 27 | 8 | 8 | 16 | 24 | 32 | 40 | 48 | 56 | 64 |
| 28 | 8 | 8 | 16 | 24 | 32 | 40 | 48 | 56 | 64 |
| 29 | 8 | 8 | 16 | 24 | 32 | 40 | 48 | 56 | 64 |
| 30 | 8 | 8 | 16 | 24 | 32 | 40 | 48 | 56 | 64 |

FIG. 21B

| Add | | | | | | | | FbDat | OUTPUT CLOCK TIME DATA 1 (S5) | | | | | | | |
|---|---|---|---|---|---|---|---|---|---|---|---|---|---|---|---|---|
| 1 | 2 | 3 | 4 | 5 | 6 | 7 | 8 | | 1 | 2 | 3 | 4 | 5 | 6 | 7 | 8 |
| | | | | | | | 64 | | | | | | | | | |
| 72 | 80 | 88 | 96 | 104 | 112 | 120 | 128 | 64 | 0 | 0 | 0 | 0 | 0 | 0 | 0 | 0 |
| 136 | 144 | 152 | 160 | 168 | 176 | 184 | 192 | 128 | 0 | 0 | 0 | 0 | 0 | 0 | 0 | 0 |
| 200 | 208 | 216 | 224 | 232 | 240 | 248 | 256 | 192 | 0 | 0 | 0 | 0 | 0 | 0 | 0 | 1 |
| 8 | 16 | 24 | 32 | 40 | 48 | 56 | 64 | 0 | 0 | 0 | 0 | 0 | 0 | 0 | 0 | 0 |
| 72 | 80 | 88 | 96 | 104 | 112 | 120 | 128 | 64 | 0 | 0 | 0 | 0 | 0 | 0 | 0 | 0 |
| 136 | 144 | 152 | 160 | 168 | 176 | 184 | 192 | 128 | 0 | 0 | 0 | 0 | 0 | 0 | 0 | 0 |
| 200 | 208 | 216 | 224 | 232 | 240 | 248 | 256 | 192 | 0 | 0 | 0 | 0 | 0 | 0 | 0 | 1 |
| 8 | 16 | 24 | 32 | 40 | 48 | 56 | 64 | 0 | 0 | 0 | 0 | 0 | 0 | 0 | 0 | 0 |
| 72 | 80 | 88 | 96 | 104 | 112 | 120 | 128 | 64 | 0 | 0 | 0 | 0 | 0 | 0 | 0 | 0 |
| 136 | 144 | 152 | 160 | 168 | 176 | 184 | 192 | 128 | 0 | 0 | 0 | 0 | 0 | 0 | 0 | 0 |
| 200 | 208 | 216 | 224 | 232 | 240 | 248 | 256 | 192 | 0 | 0 | 0 | 0 | 0 | 0 | 0 | 1 |
| 8 | 16 | 24 | 32 | 40 | 48 | 56 | 64 | 0 | 0 | 0 | 0 | 0 | 0 | 0 | 0 | 0 |
| 72 | 80 | 88 | 96 | 104 | 112 | 120 | 128 | 64 | 0 | 0 | 0 | 0 | 0 | 0 | 0 | 0 |
| 136 | 144 | 152 | 160 | 168 | 176 | 184 | 192 | 128 | 0 | 0 | 0 | 0 | 0 | 0 | 0 | 0 |
| 200 | 208 | 216 | 224 | 232 | 240 | 248 | 256 | 192 | 0 | 0 | 0 | 0 | 0 | 0 | 0 | 1 |
| 8 | 16 | 24 | 32 | 40 | 48 | 56 | 64 | 0 | 0 | 0 | 0 | 0 | 0 | 0 | 0 | 0 |
| 72 | 80 | 88 | 96 | 104 | 112 | 120 | 128 | 64 | 0 | 0 | 0 | 0 | 0 | 0 | 0 | 0 |
| 136 | 144 | 152 | 160 | 168 | 176 | 184 | 192 | 128 | 0 | 0 | 0 | 0 | 0 | 0 | 0 | 0 |
| 200 | 208 | 216 | 224 | 232 | 240 | 248 | 256 | 192 | 0 | 0 | 0 | 0 | 0 | 0 | 0 | 1 |
| 8 | 16 | 24 | 32 | 40 | 48 | 56 | 64 | 0 | 0 | 0 | 0 | 0 | 0 | 0 | 0 | 0 |
| 72 | 80 | 88 | 96 | 104 | 112 | 120 | 128 | 64 | 0 | 0 | 0 | 0 | 0 | 0 | 0 | 0 |
| 136 | 144 | 152 | 160 | 168 | 176 | 184 | 192 | 128 | 0 | 0 | 0 | 0 | 0 | 0 | 0 | 0 |
| 200 | 208 | 216 | 224 | 232 | 240 | 248 | 256 | 192 | 0 | 0 | 0 | 0 | 0 | 0 | 0 | 1 |
| 8 | 16 | 24 | 32 | 40 | 48 | 56 | 64 | 0 | 0 | 0 | 0 | 0 | 0 | 0 | 0 | 0 |
| 72 | 80 | 88 | 96 | 104 | 112 | 120 | 128 | 64 | 0 | 0 | 0 | 0 | 0 | 0 | 0 | 0 |
| 136 | 144 | 152 | 160 | 168 | 176 | 184 | 192 | 128 | 0 | 0 | 0 | 0 | 0 | 0 | 0 | 0 |
| 200 | 208 | 216 | 224 | 232 | 240 | 248 | 256 | 192 | 0 | 0 | 0 | 0 | 0 | 0 | 0 | 1 |

| FIG. 22A |
|----------|
| FIG. 22B |

| CLOCK CYCLE NUMBER | FREQUENCY CONTROL DATA (S4) (1-32) | Mpy | | | | | | | |
|---|---|---|---|---|---|---|---|---|---|
| | | 1 | 2 | 3 | 4 | 5 | 6 | 7 | 8 |
| 0 | 32 | 32 | 64 | 96 | 128 | 160 | 192 | 224 | 256 |
| 1 | 32 | 32 | 64 | 96 | 128 | 160 | 192 | 224 | 256 |
| 2 | 32 | 32 | 64 | 96 | 128 | 160 | 192 | 224 | 256 |
| 3 | 32 | 32 | 64 | 96 | 128 | 160 | 192 | 224 | 256 |
| 4 | 32 | 32 | 64 | 96 | 128 | 160 | 192 | 224 | 256 |
| 5 | 32 | 32 | 64 | 96 | 128 | 160 | 192 | 224 | 256 |
| 6 | 32 | 32 | 64 | 96 | 128 | 160 | 192 | 224 | 256 |
| 7 | 32 | 32 | 64 | 96 | 128 | 160 | 192 | 224 | 256 |
| 8 | 32 | 32 | 64 | 96 | 128 | 160 | 192 | 224 | 256 |
| 9 | 32 | 32 | 64 | 96 | 128 | 160 | 192 | 224 | 256 |
| 10 | 32 | 32 | 64 | 96 | 128 | 160 | 192 | 224 | 256 |
| 11 | 32 | 32 | 64 | 96 | 128 | 160 | 192 | 224 | 256 |
| 12 | 32 | 32 | 64 | 96 | 128 | 160 | 192 | 224 | 256 |
| 13 | 32 | 32 | 64 | 96 | 128 | 160 | 192 | 224 | 256 |
| 14 | 32 | 32 | 64 | 96 | 128 | 160 | 192 | 224 | 256 |
| 15 | 32 | 32 | 64 | 96 | 128 | 160 | 192 | 224 | 256 |
| 16 | 32 | 32 | 64 | 96 | 128 | 160 | 192 | 224 | 256 |
| 17 | 32 | 32 | 64 | 96 | 128 | 160 | 192 | 224 | 256 |
| 18 | 32 | 32 | 64 | 96 | 128 | 160 | 192 | 224 | 256 |
| 19 | 32 | 32 | 64 | 96 | 128 | 160 | 192 | 224 | 256 |
| 20 | 32 | 32 | 64 | 96 | 128 | 160 | 192 | 224 | 256 |
| 21 | 32 | 32 | 64 | 96 | 128 | 160 | 192 | 224 | 256 |
| 22 | 32 | 32 | 64 | 96 | 128 | 160 | 192 | 224 | 256 |
| 23 | 32 | 32 | 64 | 96 | 128 | 160 | 192 | 224 | 256 |
| 24 | 32 | 32 | 64 | 96 | 128 | 160 | 192 | 224 | 256 |
| 25 | 32 | 32 | 64 | 96 | 128 | 160 | 192 | 224 | 256 |
| 26 | 32 | 32 | 64 | 96 | 128 | 160 | 192 | 224 | 256 |
| 27 | 32 | 32 | 64 | 96 | 128 | 160 | 192 | 224 | 256 |
| 28 | 32 | 32 | 64 | 96 | 128 | 160 | 192 | 224 | 256 |
| 29 | 32 | 32 | 64 | 96 | 128 | 160 | 192 | 224 | 256 |
| 30 | 32 | 32 | 64 | 96 | 128 | 160 | 192 | 224 | 256 |
| 31 | 32 | 32 | 64 | 96 | 128 | 160 | 192 | 224 | 256 |
| 32 | 32 | 32 | 64 | 96 | 128 | 160 | 192 | 224 | 256 |

FIG. 22B

| Add | | | | | | | | FbDat | OUTPUT CLOCK TIME DATA 1 (S5) | | | | | | | |
|---|---|---|---|---|---|---|---|---|---|---|---|---|---|---|---|---|
| 1 | 2 | 3 | 4 | 5 | 6 | 7 | 8 | | 1 | 2 | 3 | 4 | 5 | 6 | 7 | 8 |
| | | | | | | | 64 | | | | | | | | | |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |
| 96 | 128 | 160 | 192 | 224 | 256 | 288 | 320 | 64 | 0 | 0 | 0 | 0 | 0 | 1 | 0 | 0 |

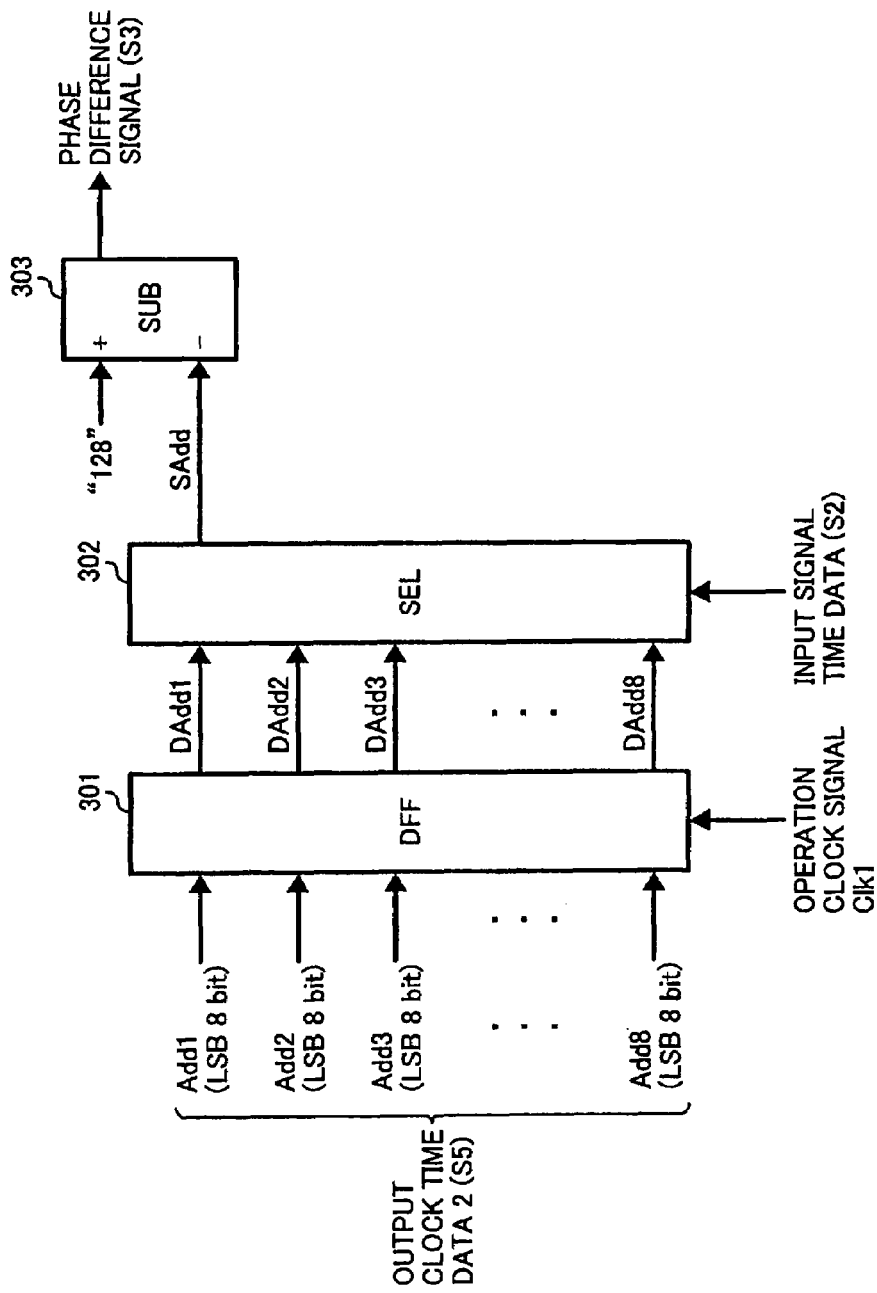

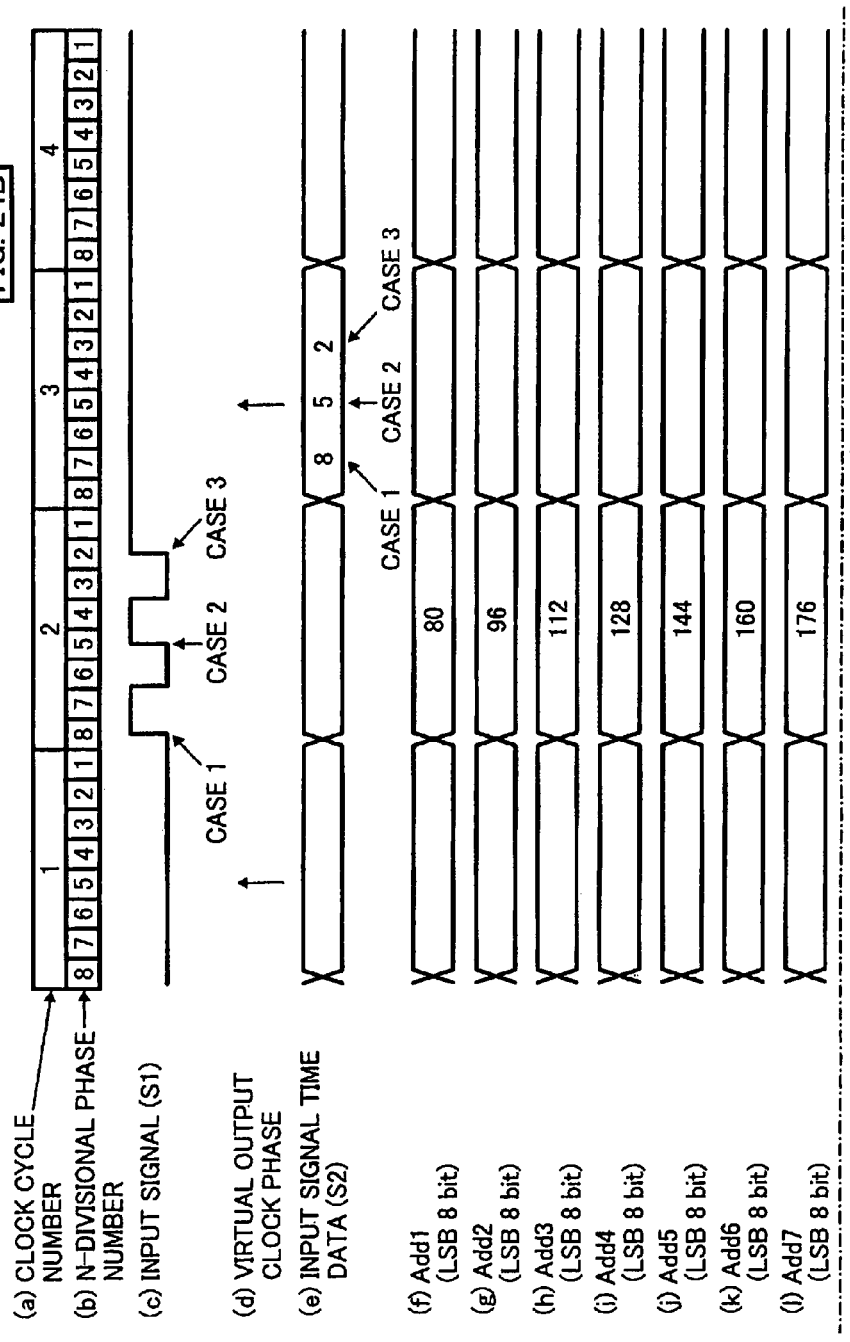

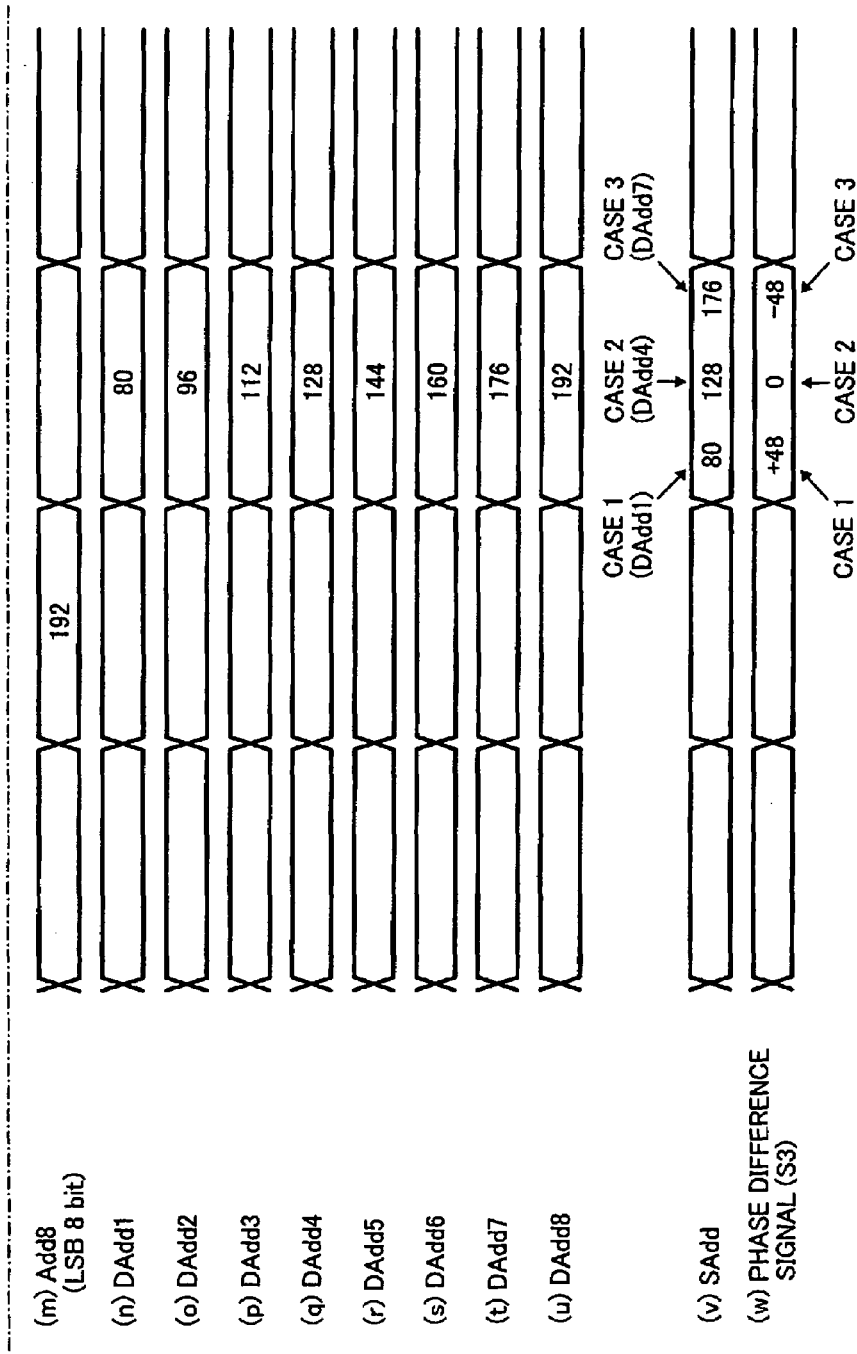

| 1ST COMBINATION LOGIC TRUTH VALUE CHART | | | | | |
|---|---|---|---|---|---|
| i1 | i2 | i3 | i4 | o1 | o2 |
| 0 | 0 | 0 | 1 | 1 | 1 |
| 1 | 1 | 1 | 0 | 1 | 1 |
| 1 | 0 | 0 | 1 | 1 | 0 |
| 0 | 1 | 1 | 0 | 1 | 0 |
| 1 | 1 | 0 | 1 | 0 | 1 |
| 0 | 0 | 1 | 0 | 0 | 1 |
| 1 | 1 | 1 | 1 | 0 | 0 |
| 0 | 0 | 0 | 0 | 0 | 0 |

| 2ND COMBINATION LOGIC TRUTH VALUE CHART | | | | |
|---|---|---|---|---|
| i1 | i2 | i3 | i4 | o (S2) |
| 1 | 1 | × | × | 4 |
| 1 | 0 | × | × | 3 |
| 0 | 1 | × | × | 2 |
| 0 | 0 | 0 | 1 | 1 |
| 0 | 0 | 1 | 0 | 1 |
| 0 | 0 | 0 | 0 | 0 |
| 0 | 0 | 1 | 1 | 0 |

FIG. 29

| CURRENT STATE St | NEXT STATE StN (S4=) | | |
|---|---|---|---|
| | -1 | 0 | 1 |
| 0 | 8 | 9 | 10 |
| 1 | 0 | 1 | 2 |
| 2 | 1 | 2 | 3 |
| 3 | 2 | 3 | 4 |
| 4 | 3 | 4 | 5 |
| 5 | 4 | 5 | 6 |
| 6 | 5 | 6 | 7 |
| 7 | 6 | 7 | 9 |
| 8 | 7 | 8 | 10 |
| 9 | 0 | 1 | 2 |
| 10 | 1 | 2 | 3 |

FIG. 30

| CURRENT STATE St | VIRTUAL OUTPUT CLOCK PHASE | | | | | | | |
|---|---|---|---|---|---|---|---|---|
| | 8 | 7 | 6 | 5 | 4 | 3 | 2 | 1 |
| 0  | – | – | – | – | – | – | – | – |
| 1  | – | – | – | – | – | – | – | I |
| 2  | – | – | – | – | – | – | I | – |
| 3  | – | – | – | – | – | I | – | – |
| 4  | – | – | – | – | I | – | – | – |
| 5  | – | – | – | I | – | – | – | – |
| 6  | – | – | I | – | – | – | – | – |
| 7  | – | I | – | – | – | – | – | – |
| 8  | I | – | – | – | – | – | – | – |
| 9  | I | – | – | – | – | – | – | I |
| 10 | I | – | – | – | – | – | I | – |

| FIG. 31A |
|----------|
| FIG. 31B |

| FREQUENCY CONTROL DATA (S4) | STATE | | | | |
|:---:|:---:|:---:|:---:|:---:|:---:|
| | St3 | St2 | St1 | St0 | StN |
| 0 | | | | 1 | 0 |
| 0 | | | | 2 | 0 |
| 0 | | | | 3 | 0 |
| 0 | | | | 4 | 0 |
| 0 | | | | 5 | 0 |
| 0 | | | | 6 | 0 |
| 0 | | | | 7 | 0 |
| 0 | | | | 8 | 0 |
| 0 | | | | 9 | 0 |
| 0 | | | | 10 | 0 |
| 0 | | | x | 11 | 0 |
| 0 | | | x | 12 | 0 |
| 0 | | | 1 | 0 | 0 |
| 0 | | | 2 | 0 | 0 |
| 0 | | | 3 | 0 | 0 |
| 0 | | | 4 | 0 | 0 |
| 0 | | | 5 | 0 | 0 |
| 0 | | | 6 | 0 | 0 |
| 0 | | | 7 | 0 | 0 |
| 0 | | | 8 | 0 | 0 |
| 0 | | | 9 | 0 | 0 |
| 0 | | | 10 | 0 | 0 |
| 0 | | x | 11 | 0 | 0 |
| 0 | | x | 12 | 0 | 0 |

FIG. 31B

| 0 |   | 1  | 0 | 0 | 0  |
|---|---|----|---|---|----|
| 0 |   | 2  | 0 | 0 | 0  |
| 0 |   | 3  | 0 | 0 | 0  |
| 0 |   | 4  | 0 | 0 | 0  |
| 0 |   | 5  | 0 | 0 | 0  |
| 0 |   | 6  | 0 | 0 | 0  |
| 0 |   | 7  | 0 | 0 | 0  |
| 0 |   | 8  | 0 | 0 | 0  |
| 0 |   | 9  | 0 | 0 | 0  |
| 0 |   | 10 | 0 | 0 | 0  |
| 0 | × | 11 | 0 | 0 | 0  |
| 0 | × | 12 | 0 | 0 | 0  |
| 0 | 1 | 0  | 0 | 0 | 1  |
| 0 | 2 | 0  | 0 | 0 | 2  |
| 0 | 3 | 0  | 0 | 0 | 3  |
| 0 | 4 | 0  | 0 | 0 | 4  |
| 0 | 5 | 0  | 0 | 0 | 5  |
| 0 | 6 | 0  | 0 | 0 | 6  |
| 0 | 7 | 0  | 0 | 0 | 7  |
| 0 | 8 | 0  | 0 | 0 | 8  |
| 0 | 9 | 0  | 0 | 0 | 9  |
| 0 | 10| 0  | 0 | 0 | 10 |
| 0 | 11| 0  | 0 | 0 | 11 |
| 0 | 12| 0  | 0 | 0 | 12 |
| 0 | 0 | 0  | 0 | 0 | 12 |

| FREQUENCY CONTROL DATA (S4) | STATE | | | | |
|---|---|---|---|---|---|
| | St3 | St2 | St1 | St0 | StN |
| 1 | | | | 1 | 0 |
| 1 | | | | 2 | 0 |
| 1 | | | | 3 | 0 |
| 1 | | | | 4 | 0 |
| 1 | | | | 5 | 0 |
| 1 | | | | 6 | 0 |
| 1 | | | | 7 | 0 |
| 1 | | | | 8 | 0 |
| 1 | | | | 9 | 0 |
| 1 | | | | 10 | 0 |
| 1 | | | × | 11 | 0 |
| 1 | | | × | 12 | 0 |
| 1 | | | 1 | 0 | 0 |
| 1 | | | 2 | 0 | 0 |
| 1 | | | 3 | 0 | 0 |
| 1 | | | 4 | 0 | 0 |
| 1 | | | 5 | 0 | 0 |
| 1 | | | 6 | 0 | 0 |
| 1 | | | 7 | 0 | 0 |
| 1 | | | 8 | 0 | 0 |
| 1 | | | 9 | 0 | 0 |
| 1 | | | 10 | 0 | 0 |
| 1 | | × | 11 | 0 | 0 |
| 1 | | × | 12 | 0 | 0 |

FIG. 32B

| | | | | | |
|---|---|---|---|---|---|
| 1 | | 1 | 0 | 0 | 0 |
| 1 | | 2 | 0 | 0 | 0 |
| 1 | | 3 | 0 | 0 | 0 |
| 1 | | 4 | 0 | 0 | 0 |
| 1 | | 5 | 0 | 0 | 0 |
| 1 | | 6 | 0 | 0 | 0 |
| 1 | | 7 | 0 | 0 | 0 |
| 1 | | 8 | 0 | 0 | 0 |
| 1 | | 9 | 0 | 0 | 0 |
| 1 | | 10 | 0 | 0 | 0 |
| 1 | × | 11 | 0 | 0 | 0 |
| 1 | × | 12 | 0 | 0 | 1 |
| 1 | 1 | 0 | 0 | 0 | 2 |
| 1 | 2 | 0 | 0 | 0 | 3 |
| 1 | 3 | 0 | 0 | 0 | 4 |
| 1 | 4 | 0 | 0 | 0 | 5 |
| 1 | 5 | 0 | 0 | 0 | 6 |
| 1 | 6 | 0 | 0 | 0 | 7 |
| 1 | 7 | 0 | 0 | 0 | 8 |
| 1 | 8 | 0 | 0 | 0 | 9 |
| 1 | 9 | 0 | 0 | 0 | 10 |
| 1 | 10 | 0 | 0 | 0 | 11 |
| 1 | 11 | 0 | 0 | 0 | 12 |
| 1 | 12 | 0 | 0 | 0 | 12 |
| 1 | 0 | 0 | 0 | 0 | 12 |

| FIG. 33A |
|----------|
| FIG. 33B |

| FREQUENCY CONTROL DATA (S4) | STATE ||||| 
|---|---|---|---|---|---|
| | St3 | St2 | St1 | St0 | StN |
| 2 | | | | 1 | 0 |
| 2 | | | | 2 | 0 |
| 2 | | | | 3 | 0 |
| 2 | | | | 4 | 0 |
| 2 | | | | 5 | 0 |
| 2 | | | | 6 | 0 |
| 2 | | | | 7 | 0 |
| 2 | | | | 8 | 0 |
| 2 | | | | 9 | 0 |
| 2 | | | | 10 | 0 |
| 2 | | | × | 11 | 0 |
| 2 | | | × | 12 | 0 |
| 2 | | | 1 | 0 | 0 |
| 2 | | | 2 | 0 | 0 |
| 2 | | | 3 | 0 | 0 |
| 2 | | | 4 | 0 | 0 |
| 2 | | | 5 | 0 | 0 |
| 2 | | | 6 | 0 | 0 |
| 2 | | | 7 | 0 | 0 |
| 2 | | | 8 | 0 | 0 |
| 2 | | | 9 | 0 | 0 |
| 2 | | | 10 | 0 | 0 |
| 2 | | × | 11 | 0 | 0 |
| 2 | | × | 12 | 0 | 0 |

FIG. 33B

| | | | | | |
|---|---|---|---|---|---|
| 2 | | 1 | 0 | 0 | 0 |
| 2 | | 2 | 0 | 0 | 0 |
| 2 | | 3 | 0 | 0 | 0 |
| 2 | | 4 | 0 | 0 | 0 |
| 2 | | 5 | 0 | 0 | 0 |
| 2 | | 6 | 0 | 0 | 0 |
| 2 | | 7 | 0 | 0 | 0 |
| 2 | | 8 | 0 | 0 | 0 |
| 2 | | 9 | 0 | 0 | 0 |
| 2 | | 10 | 0 | 0 | 0 |
| 2 | × | 11 | 0 | 0 | 1 |
| 2 | × | 12 | 0 | 0 | 2 |
| 2 | 1 | 0 | 0 | 0 | 3 |
| 2 | 2 | 0 | 0 | 0 | 4 |
| 2 | 3 | 0 | 0 | 0 | 5 |
| 2 | 4 | 0 | 0 | 0 | 6 |
| 2 | 5 | 0 | 0 | 0 | 7 |
| 2 | 6 | 0 | 0 | 0 | 8 |
| 2 | 7 | 0 | 0 | 0 | 9 |
| 2 | 8 | 0 | 0 | 0 | 10 |
| 2 | 9 | 0 | 0 | 0 | 11 |
| 2 | 10 | 0 | 0 | 0 | 12 |
| 2 | 11 | 0 | 0 | 0 | 12 |
| 2 | 12 | 0 | 0 | 0 | 12 |
| 2 | 0 | 0 | 0 | 0 | 12 |

| FREQUENCY CONTROL DATA (S4) | STATE | | | | |
|---|---|---|---|---|---|
| | St3 | St2 | St1 | St0 | StN |
| 35 | | | | 1 | 0 |
| 35 | | | | 2 | 1 |
| 35 | | | | 3 | 2 |
| 35 | | | | 4 | 3 |
| 35 | | | | 5 | 4 |
| 35 | | | | 6 | 5 |
| 35 | | | | 7 | 6 |
| 35 | | | | 8 | 7 |
| 35 | | | | 9 | 8 |
| 35 | | | | 10 | 9 |
| 35 | | | × | 11 | 10 |
| 35 | | | × | 12 | 11 |
| 35 | | | 1 | 0 | 12 |
| 35 | | | 2 | 0 | 12 |
| 35 | | | 3 | 0 | 12 |
| 35 | | | 4 | 0 | 12 |
| 35 | | | 5 | 0 | 12 |
| 35 | | | 6 | 0 | 12 |
| 35 | | | 7 | 0 | 12 |
| 35 | | | 8 | 0 | 12 |
| 35 | | | 9 | 0 | 12 |
| 35 | | | 10 | 0 | 12 |
| 35 | | × | 11 | 0 | 12 |
| 35 | | × | 12 | 0 | 12 |

FIG. 34B

| 35 |   | 1  | 0 | 0 | 12 |
|----|---|----|---|---|----|
| 35 |   | 2  | 0 | 0 | 12 |
| 35 |   | 3  | 0 | 0 | 12 |
| 35 |   | 4  | 0 | 0 | 12 |
| 35 |   | 5  | 0 | 0 | 12 |
| 35 |   | 6  | 0 | 0 | 12 |
| 35 |   | 7  | 0 | 0 | 12 |
| 35 |   | 8  | 0 | 0 | 12 |
| 35 |   | 9  | 0 | 0 | 12 |
| 35 |   | 10 | 0 | 0 | 12 |
| 35 | × | 11 | 0 | 0 | 12 |
| 35 | × | 12 | 0 | 0 | 12 |
| 35 | 1 | 0 | 0 | 0 | 12 |
| 35 | 2 | 0 | 0 | 0 | 12 |
| 35 | 3 | 0 | 0 | 0 | 12 |
| 35 | 4 | 0 | 0 | 0 | 12 |
| 35 | 5 | 0 | 0 | 0 | 12 |
| 35 | 6 | 0 | 0 | 0 | 12 |
| 35 | 7 | 0 | 0 | 0 | 12 |
| 35 | 8 | 0 | 0 | 0 | 12 |
| 35 | 9 | 0 | 0 | 0 | 12 |
| 35 | 10 | 0 | 0 | 0 | 12 |
| 35 | 11 | 0 | 0 | 0 | 12 |
| 35 | 12 | 0 | 0 | 0 | 12 |
| 35 | 0 | 0 | 0 | 0 | 12 |

| FIG. 35A |
|----------|
| FIG. 35B |

| FREQUENCY | STATE | | | | |
| CONTROL DATA (S4) | St3 | St2 | St1 | St0 | StN |
|---|---|---|---|---|---|
| 36 | | | | 1 | 1 |
| 36 | | | | 2 | 2 |
| 36 | | | | 3 | 3 |
| 36 | | | | 4 | 4 |
| 36 | | | | 5 | 5 |
| 36 | | | | 6 | 6 |
| 36 | | | | 7 | 7 |
| 36 | | | | 8 | 8 |
| 36 | | | | 9 | 9 |
| 36 | | | | 10 | 10 |
| 36 | | | × | 11 | 11 |
| 36 | | | × | 12 | 12 |
| 36 | | | 1 | 0 | 12 |
| 36 | | | 2 | 0 | 12 |
| 36 | | | 3 | 0 | 12 |
| 36 | | | 4 | 0 | 12 |
| 36 | | | 5 | 0 | 12 |
| 36 | | | 6 | 0 | 12 |
| 36 | | | 7 | 0 | 12 |
| 36 | | | 8 | 0 | 12 |
| 36 | | | 9 | 0 | 12 |
| 36 | | | 10 | 0 | 12 |
| 36 | | × | 11 | 0 | 12 |
| 36 | | × | 12 | 0 | 12 |

FIG. 35B

| | | | | | |
|---|---|---|---|---|---|
| 36 | | 1 | 0 | 0 | 12 |
| 36 | | 2 | 0 | 0 | 12 |
| 36 | | 3 | 0 | 0 | 12 |
| 36 | | 4 | 0 | 0 | 12 |
| 36 | | 5 | 0 | 0 | 12 |
| 36 | | 6 | 0 | 0 | 12 |
| 36 | | 7 | 0 | 0 | 12 |
| 36 | | 8 | 0 | 0 | 12 |
| 36 | | 9 | 0 | 0 | 12 |
| 36 | | 10 | 0 | 0 | 12 |
| 36 | × | 11 | 0 | 0 | 12 |
| 36 | × | 12 | 0 | 0 | 12 |
| 36 | 1 | 0 | 0 | 0 | 12 |
| 36 | 2 | 0 | 0 | 0 | 12 |
| 36 | 3 | 0 | 0 | 0 | 12 |
| 36 | 4 | 0 | 0 | 0 | 12 |
| 36 | 5 | 0 | 0 | 0 | 12 |
| 36 | 6 | 0 | 0 | 0 | 12 |
| 36 | 7 | 0 | 0 | 0 | 12 |
| 36 | 8 | 0 | 0 | 0 | 12 |
| 36 | 9 | 0 | 0 | 0 | 12 |
| 36 | 10 | 0 | 0 | 0 | 12 |
| 36 | 11 | 0 | 0 | 0 | 12 |
| 36 | 12 | 0 | 0 | 0 | 12 |
| 36 | 0 | 0 | 0 | 0 | 12 |

FIG. 36

| CURRENT STATE St0 | VIRTUAL OUTPUT CLOCK PHASE | | | | | | | | | | | |
|---|---|---|---|---|---|---|---|---|---|---|---|---|
| | 12 | 11 | 10 | 9 | 8 | 7 | 6 | 5 | 4 | 3 | 2 | 1 |
| 0 | — | — | — | — | — | — | — | — | — | — | — | — |
| 1 | — | — | — | — | — | — | — | — | — | — | — | I |
| 2 | — | — | — | — | — | — | — | — | — | — | I | — |
| 3 | — | — | — | — | — | — | — | — | — | I | — | — |
| 4 | — | — | — | — | — | — | — | — | I | — | — | — |
| 5 | — | — | — | — | — | — | — | I | — | — | — | — |
| 6 | — | — | — | — | — | — | I | — | — | — | — | — |
| 7 | — | — | — | — | — | I | — | — | — | — | — | — |
| 8 | — | — | — | — | I | — | — | — | — | — | — | — |
| 9 | — | — | — | I | — | — | — | — | — | — | — | — |
| 10 | — | — | I | — | — | — | — | — | — | — | — | — |
| 11 | — | I | — | — | — | — | — | — | — | — | — | — |
| 12 | I | — | — | — | — | — | — | — | — | — | — | — |

FINE CLOCK RESOLUTION DIGITAL PHASE LOCKED LOOP APPARATUS

CROSS-REFERENCE TO RELATED APPLICATIONS

This application is a continuation of U.S. patent application Ser. No. 11/354,183, filed Feb. 15, 2006, now U.S. Pat. No. 7,298,216 which claims priority under 35 U.S.C. § 119 to Japanese Patent Application No. 2005-038890 filed on Feb. 16, 2005, the entire contents of which are hereby incorporated by reference.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Technical Field

This invention relates to a digital phase locked loop apparatus including a phase locked loop circuit, which generates a reproduction clock in synchronism with reproduction data of an optical disc apparatus or a magnetic disc apparatus, as well as a recordation clock in synchronism with a wobble signal of the optical disc apparatus.

2. Discussion of the Background Art

A phase synchronization loop circuit (a phase locked loop circuit) is utilized in a data reproducing apparatus that reproduces data from a rotational storage medium, such as an optical disc, a magnetic disc, etc., to obtain a clock that synchronizes with reproduction data. The phase locked loop circuit is almost realized by an analog circuit that employs a voltage-controlled oscillator. However, a self-running frequency of such an analog voltage controlled oscillator tends to vary in accordance with a change in environment temperature or power supply voltage, thereby resulting in a long pull-in time of the phase locked loop circuit. Then, a digital phase locked loop circuit has been proposed as discussed in Japanese Patent Application Laid Open No. 60.245312.

Since the digital phase locked loop circuit does not employ an analog voltage controlled oscillator, the above-mentioned variation does not occur, and a self-running frequency is stable with a frequency clock precision (i.e., crystal precision) provided as a reference. Further, since being entirely configured by a digital circuit, the digital phase locked loop circuit can be easily mounted on an integrated circuit, thereby an apparatus can be downsized and is low cost.

FIG. 25 is a block diagram illustrating an exemplary configuration of a conventional digital phase locked loop circuit. FIG. 26 illustrates an operational wave appearing in the digital phase locked loop circuit of FIG. 25. The digital phase locked loop circuit includes a phase comparator 700, a counter 701, an incrementer-decrementer 702, and a divider 703.

The digital phase locked loop circuit needs a high frequency clock as an operational clock PC2 used in the phase locked loop when time resolution of a phase of an output clock FS thereof is to be enhanced. For example, a frequency of thirty-two times of a reproduction data rate is required as an operational clock in the digital phase locked loop circuit when time resolution of an output clock phase of the digital phase locked loop is to be thirty-two times of the reproduction data rate.

However, recordation and reproduction speeds for a CD and a DVD have significantly increased, and recently, the internal operational clock frequency has become extraordinarily high in the above-mentioned conventional digital phase locked loop circuit.

As a result, it exceeds an operation frequency limit for the circuit, thereby the digital phase locked loop circuit becomes inoperative when the reproduction data rate is large. This invention is made in view of the above-mentioned aspects, and it is an object of the invention to achieve a fine time resolution of an output clock phase while using a relatively low frequency of an operational clock.

BRIEF SUMMARY OF THE INVENTION

Accordingly, an object of the present invention is to address and resolve such and other problems and provide a new digital phase locked loop apparatus. The new and novel digital phase locked loop apparatus includes an input signal time detecting device (2) that detects a phase of an input signal (S1) with prescribed time resolution obtained by dividing a cycle of an operation clock generated by a clock generator at a prescribed time (N). The input signal time detecting device (2) outputs input signal time data (S2) in accordance with the detection result per the one cycle. An output clock generating device (5) outputs output clock time data (S5) per the one cycle in accordance with frequency control data. The output clock time data has a value corresponding to a phase of a virtual output clock generated by dividing the operation clock in accordance with the time resolution. A phase difference detecting device (3) detects a difference between phases of the input signal and the virtual output clock, and outputs a phase difference signal (S3) in accordance with the detection result. The frequency control device (4) changes the frequency control data (S4) in accordance with the phase difference signal (S3).

In another embodiment, the clock generator generates a multi phase clock including a plurality of phase clock signals having different phases by a scale of time resolution per one cycle.

In yet another embodiment, the output clock generating device (5) is operated by a clock of the one cycle and stores a state in accordance with a phase of the virtual output clock. The output clock generating device (5) determines the next state based on a relation between the frequency control data and a current state. The output clock generating device (5) outputs output clock time data in accordance with the next state.

In yet another embodiment, the output clock generating device (5) is operated by a clock of the one cycle and including a plurality of storage devices to store a current state and one or more past states in accordance with a phase of the virtual output clock. The output clock generating device (5) determines the next state based on a relation between the frequency control data, a current state, and the one or more past states. The output clock generating device (5) outputs output clock time data in accordance with the next state.

In yet another embodiment, the output clock generating device (5) includes a prescribed number (N) of multipliers that multiply the frequency control data and one to the prescribed number (N) of positive integer, respectively, a storage device configured to store data input per clock of the one cycle, and a prescribed number (N) of adders that add the data stored in the storage device to outputs from the prescribed number (N) of multipliers. An output of one of the prescribed number (N) of adders is input to the storage device, and the outputs from the prescribed number (N) of adders constitute the output clock time data.

In yet another embodiment, the phase difference detecting device (3) selects an output from one of the prescribed number (N) of adders in accordance with the input signal time data (S2). The phase difference detecting device (3) detects the phase difference based on the selected output, and outputs the phase difference signal (S3) in accordance with the detection result.

According to the invention of the digital phase locked loop apparatus, fine time resolution of an output clock phase is obtained while maintaining a frequency of an operational clock to be relatively low.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 10 illustrates a change of data when the output clock generation section 5 of FIG. 9 operates;

FIG. 12 illustrates a change of data when the output clock generation section 5 of FIG. 11 operates;

FIG. 13 illustrates a change of data when the output clock generation section 5 of FIG. 11 operates;

FIG. 14 illustrates a change of data when the output clock generation section 5 of FIG. 11 operates;

FIG. 15 illustrates a change of data when the output clock generation section 5 of FIG. 11 operates;

FIG. 16 illustrates a change of data when the output clock generation section 5 of FIG. 11 operates;

FIG. 18 illustrates a change of data when the output clock generation section 5 of FIG. 17 operates;

FIG. 19 illustrates a change of data when the output clock generation section 5 of FIG. 17 operates;

FIG. 20 illustrates a change of data when the output clock generation section 5 of FIG. 17 operates;

FIG. 21 illustrates a change of data when the output clock generation section 5 of FIG. 17 operates;

FIG. 22 illustrates a change of data when the output clock generation section 5 of FIG. 17 operates;

FIG. 23 is a block diagram illustrating an exemplary configuration of a phase difference detection section 3 used in a digital phase locked loop circuit of a sixth embodiment according to present invention;

FIG. 24 is a wave of an output signal of each of sections when the phase difference detection section 3 of FIG. 23 operates;

FIG. 26 illustrates operational waves appearing in the digital phase locked loop circuit of FIG. 25; and FIGS. 27 to 36 illustrate first to tenth charts, respectively, to be referred to in relation to respective embodiments of the present invention.

DETAILED DESCRIPTION OF THE INVENTION

Figure 1:
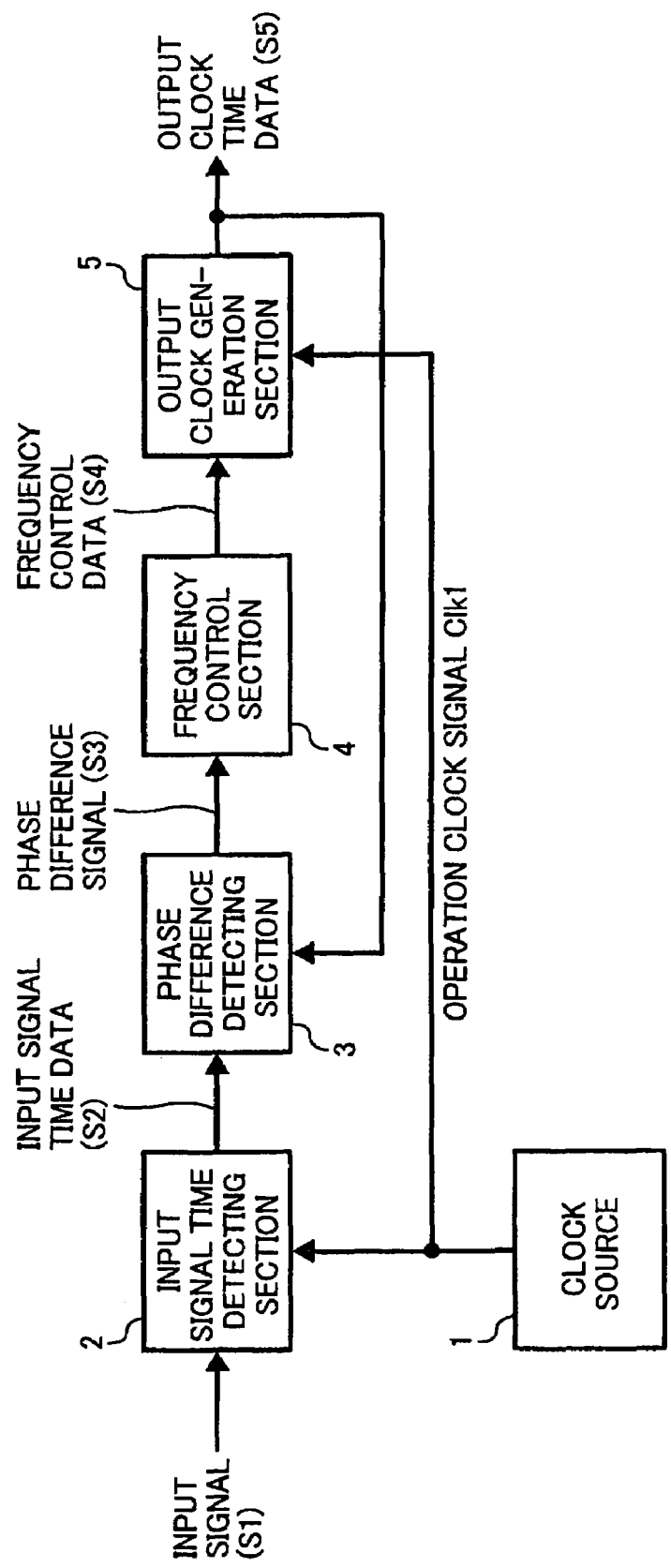
FIG. 1 illustrates an exemplary configuration of a digital phase locked loop circuit of a first embodiment of the present invention.
Figure 2:
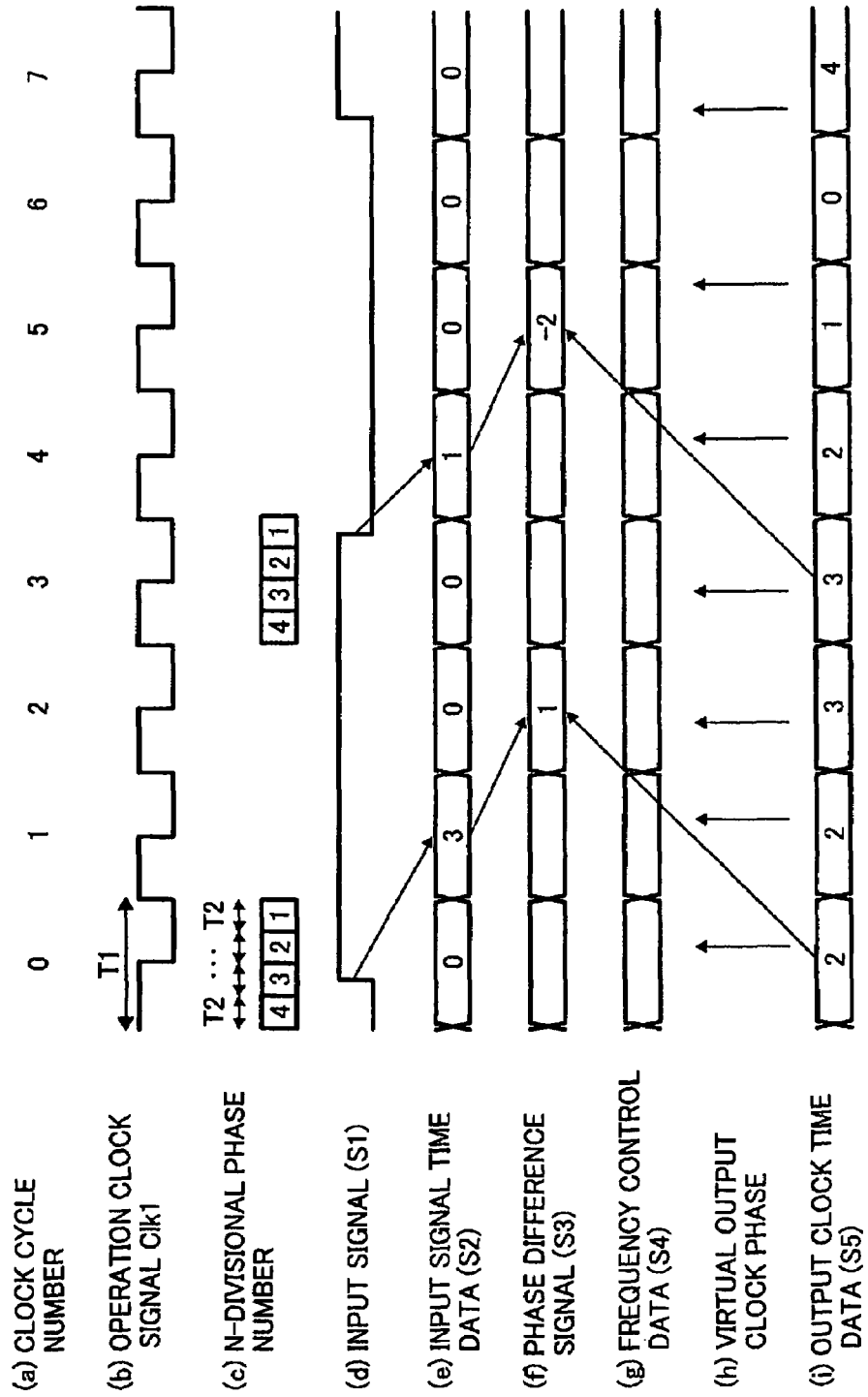
FIG. 2 illustrates exemplary operational waves appearing in the digital phase locked loop circuit of FIG. 1.

Referring now to the drawings, wherein like reference numerals designate identical or corresponding parts throughout several views, in particular in FIG. 1, an exemplary configuration of a digital phase locked loop circuit (DPLC) of a first embodiment of the present invention is illustrated. FIG. 2 illustrates operational waves appearing in the digital phase locked loop circuit of FIG. 1. As shown in FIG. 1, a clock source 1 provides an operational clock signal Clk1 having a cycle T1 to each of an input signal time detection section 2, and an output clock generation section 5. The input signal time detection section 2 detects a phase of an input signal S1 input to the digital phase locked loop circuit with time resolution T2 (T2=T1/N), which is obtained by dividing the cycle T1 of the operational clock signal Clk1 by N times. The input signal time detection section 2 outputs data per cycle of the operational clock signal Clk1.

It is conditioned in the operational wave chart of FIG. 2 that the formulas T2=T1/4 and N=4 are established. The larger the N, the finer the detection resolution in the input signal time detection section 2. However, the equality N=4 is used for the purpose of easy comprehension. As shown in FIG. 2(a), clock cycle numbers 0 to 7 are assigned to respective cycles of the operational clock signal Clk1 for explaining an operation. As shown in FIG. 2(c), phases obtained by dividing a cycle of the operational clock signal Clk1 by N times (e.g. four) into a unit of T2 are assigned with N time division phase numbers from 4 to 1. Here, a larger N time division phase number represents an earlier time.

As shown, an input signal S1 changes from low (L) to high (H) at a time corresponding to the N time division phase number 3 of the clock cycle number 0. When detecting such a changing edge, the input signal time detection section 2 outputs the N time division phase number at the time as input signal time data S2 during a cycle of the next operational clock signal Clk1. As shown in FIG. 2(e), data "3" is output as an input signal time data S2 when the clock cycle number of FIG. 2(a) is "1". When a changing edge of the input signal S1 does not appear during a cycle of the operational clock signal Clk1, the input signal time detection section 2 causes input signal time data S2 output during the next cycle of the operational clock signal Clk1 to be "0".

Figure 3:
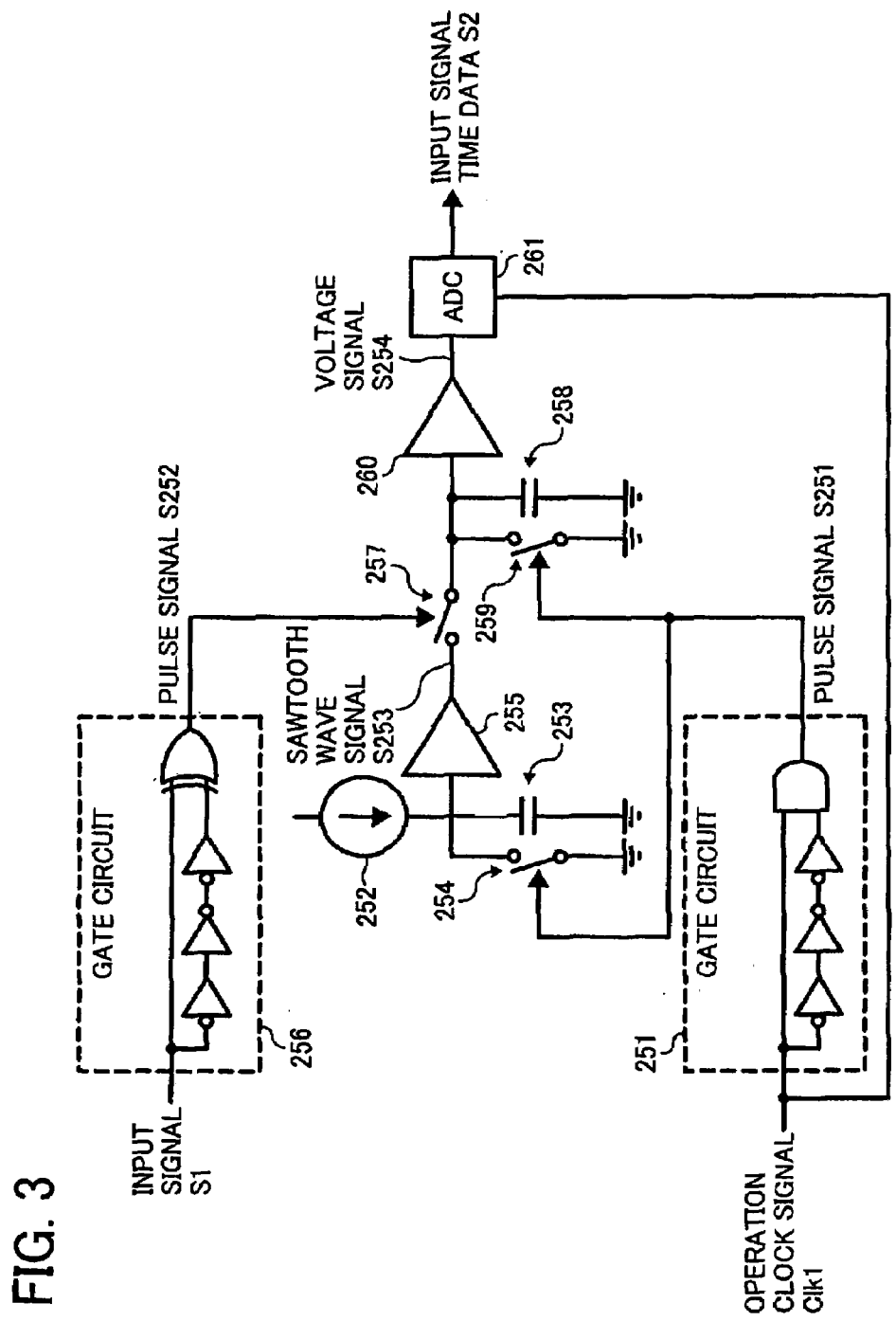
FIG. 3 illustrates an exemplary interior configuration of an input signal time detection section 2 illustrated in FIG. 1.
Figure 4:
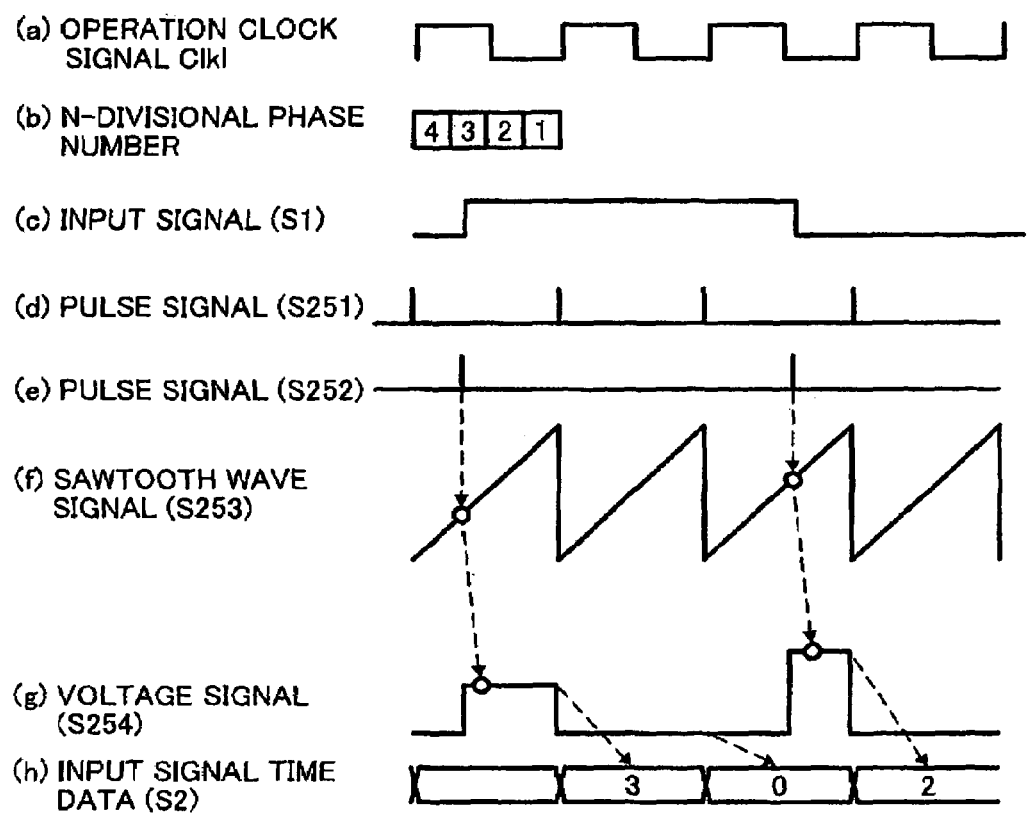
FIG. 4 illustrates exemplary operational waves appearing in the input signal time detection section 2 of FIG. 3.

Since a changing edge of the input signal S1 does not exist when the clock cycle numbers are "1" and "2" as shown in FIG. 2(a), the input signal time data S2 in clock cycle numbers "2" and "3" thereof becomes "0" as shown in FIG. 2(e). FIG. 3 illustrates an exemplary interior configuration of an input signal time detection section 2 illustrated in FIG. 1. FIG. 4 illustrates an exemplary operational wave appearing in the input signal time detection section 2 of FIG. 3. A gate circuit 251 detects a rising edge of the operational clock signal Clk1 and outputs a pulse signal S251 as shown in FIG. 4(d). A power supply source 252 continuously charges a condenser 253 with a constant current. A switch 254 discharges electric charge of the condenser every time when the pulse signal S251 is generated.

As a result, a signal obtained by detecting the charged voltage of the condenser 253 via a buffer 255 comes to have the same frequency as the operational clock signal Clk1 and forms a wave signal having a saw shape (a sawtooth wave signal) as shown in FIG. 4(f). Thus, a saw wave signal S253 as shown in (f) is output from the buffer 255.

The gate circuit 256 detects both rising and descending edges of the input signal S1 as shown in FIG. 4(c), and outputs a pulse signal S252 as shown in FIG. 4(e).

When the pulse signal S252 is generated, the switch 257 is turned on (ON), and a voltage of the saw wave signal S253 charges the condenser S252. The charged voltage is maintained until being discharged by the switch 259 that is turned on (ON) by a pulse signal S251.

Then, a signal obtained by detecting a charged voltage of the condenser 258 via a buffer 260 causes a voltage signal S254 corresponding to a phase of the generated input signal S1 as shown in FIG. 4(g). By applying AD conversion to the voltage signal S254 from analog to digital using an AD converter (ADC in the drawing) 261, input signal time data S2 having a value corresponding to the phase of the input signal S1 can be obtained as shown in FIG. 4(h). The output clock generation section 5 changes an edge phase of a virtual output clock with time resolution T2 in accordance with frequency control data S4. However, the virtual output clock is not practically output. Instead, output clock time data S5 having a value corresponding to an edge phase of the virtual output clock is output per cycle of the operational clock signal Clk1.

As represented by the operational waves in FIG. 2, the output clock generation section 5 causes the edge phase of the virtual output clock to position at the N time division phase number "2" when a clock cycle number of FIG. 2(a) is "0". Data "2" is thus practically output as output clock time data S5 as shown in FIG. 2(i). Similarly, when the clock cycle numbers of FIG. 2(a) are 1, 2, and 3, the output clock generation section 5 causes phases of the virtual output clock to position at N time division phase numbers "2", "3", and "3", respectively, and practically outputs data "2", "3", and "3" as output clock time data S5 as shown in FIG. 2(i). An edge of a virtual output clock is not generated during the cycle in the clock cycle number "6".

In this situation, the output clock generation section 5 outputs data "0" as output clock time data S5. A phase difference detection section 3 detects a phase difference between the input signal and the virtual output clock based on the input signal time data S2 and the output clock time data S5, and outputs a phase difference signal S3 having a value corresponding to the detection result per cycle of the operational clock signal Clk1. Since the phase of an input signal S1 of FIG. 2(d) corresponds to the N time division phase number "3" as shown in FIG. 2(c), and the virtual output clock phase of FIG. 2(h) corresponds to the N time division phase number "2", the phase of the input signal S1 advances by one N time division phase number from that of the virtual output clock when the clock cycle number of FIG. 2(a) is "0".

The phase difference detection section 3 detects a phase difference between input signal time data S2 obtained in the clock cycle number "1" of FIG. 2(a) and output clock time data S5 obtained in the clock cycle number "0", and outputs a phase difference signal S3 having the value "1" in the cycle of the clock cycle number "2". When a changing edge of the input signal S1 or an edge of the virtual output clock does not appear during a cycle of an operational clock signal Clk1, the value of the phase difference signal S3 becomes "0". The frequency control section 4 changes frequency control data S4 in accordance with the phase difference signal S3. As a result, a feedback loop is formed, and the phase of the virtual output clock can synchronize with the input signal S1.

As generally known as a phase locked loop technology, the frequency control section 4 generates frequency control data S4 by either multiplying a phase difference signal S3 and a prescribed gain or lifting a gain in a low frequency region.

Thus, the digital phase locked loop circuit of FIG. 1 can increase time resolution of a virtual output clock phase about N times while using an operational clock signal Clk1 having a relatively low frequency with a cycle T1.

Thus, an output clock phase of fine time resolution can be provided while using a clock having a relatively low frequency. Because, the input signal time detection section 2 detects a phase of an input signal S1 with time resolution T2 (T2=T1/N) calculated by dividing the cycle T1 N times, and outputs input signal time data S2 having a value corresponding to the detection result per cycle T1. Further because, the output clock generation section 5 changes a phase of the virtual output clock with time resolution T2 in accordance with frequency control data, and outputs output clock time data S5 having a value corresponding to a virtual output clock phase per cycle T1. Accordingly, fine time resolution of an output clock phase can be realized using a relatively low frequency operational clock.

A second exemplary embodiment is now described.

Figure 5:
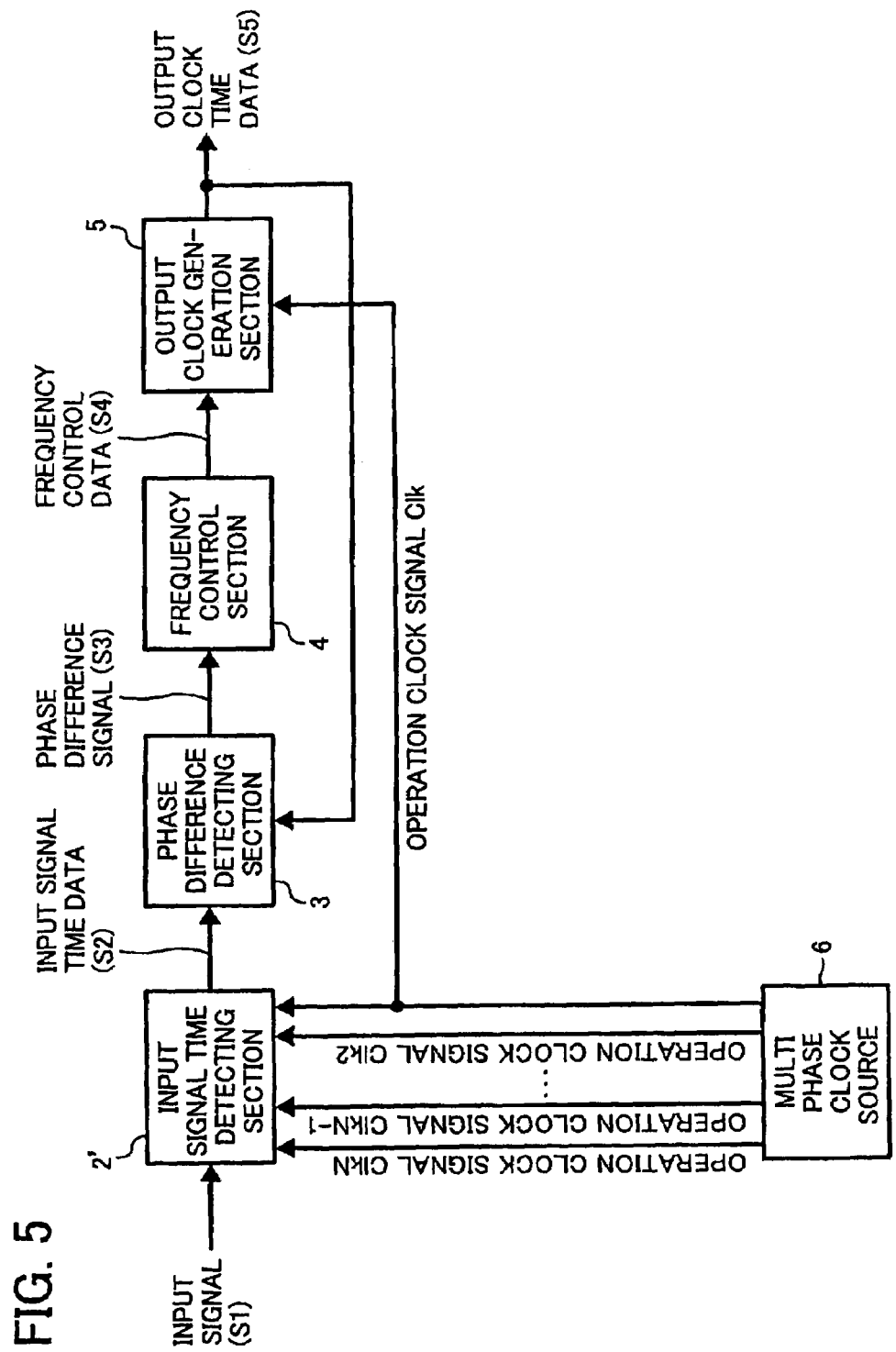
FIG. 5 is a block diagram illustrating an exemplary configuration of a digital phase locked loop circuit of a second embodiment according to the present invention.

FIG. 5 is a block diagram illustrating an exemplary configuration of a digital phase locked loop circuit of a second embodiment according to the present invention.

Figure 6:
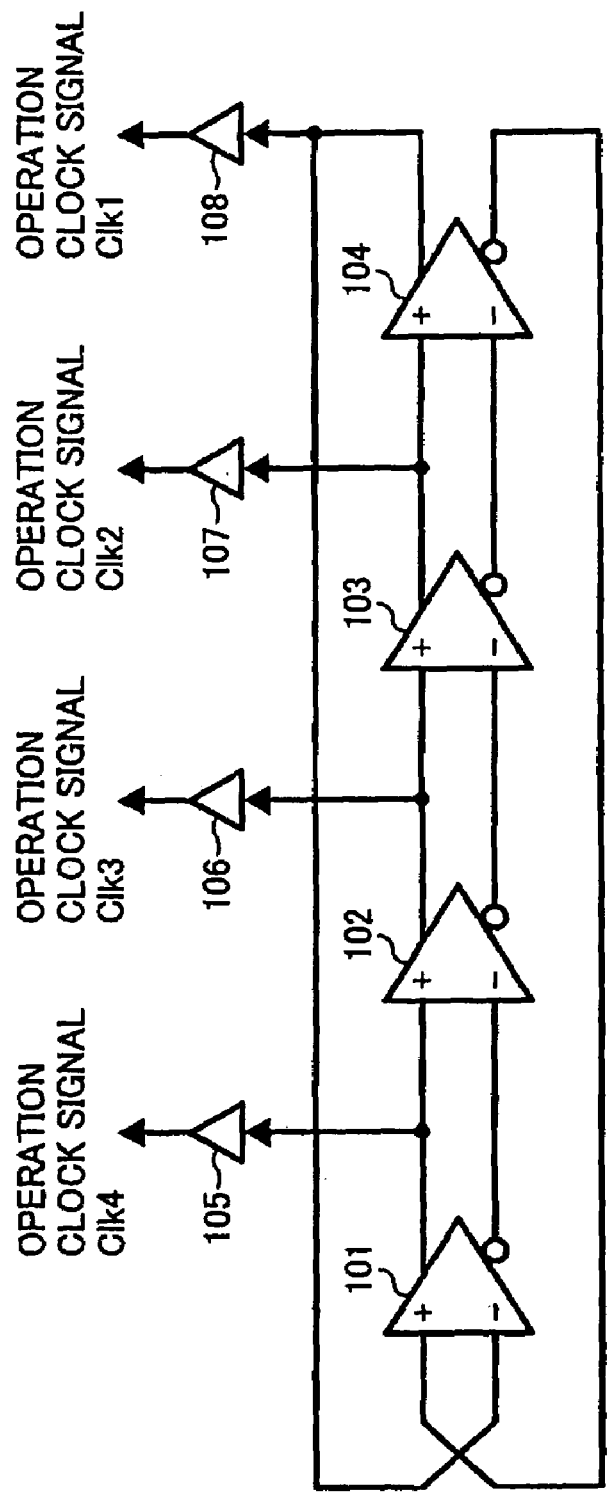
FIG. 6 is a block diagram illustrating an exemplary configuration of a multi phase clock source 6 used in the digital phase locked loop circuit of FIG. 5.
Figure 7:
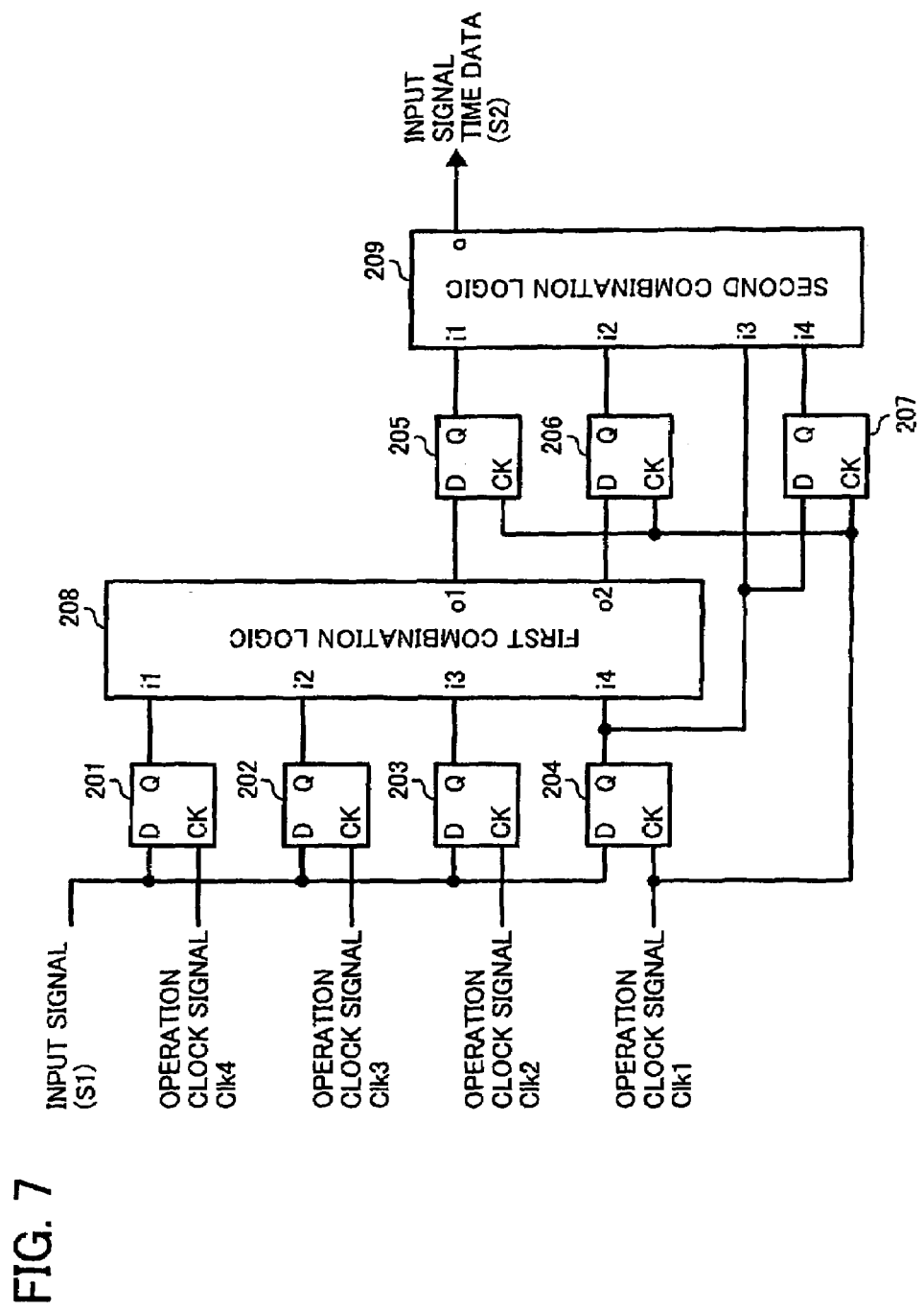
FIG. 7 is a block diagram illustrating an exemplary configuration of an input signal time detection section 2 used in the digital phase locked loop circuit of FIG. 5.
Figure 8:
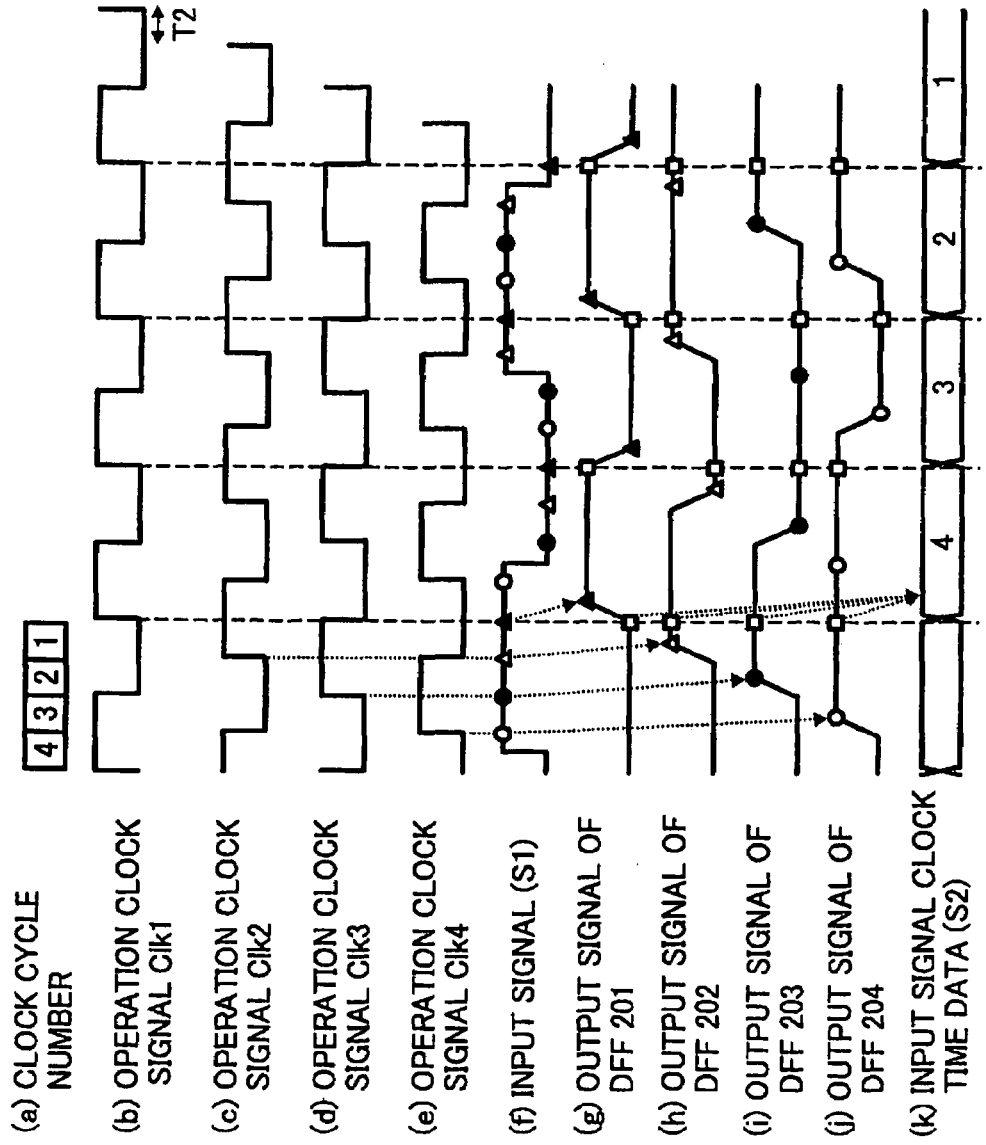
FIG. 8 illustrates an operational wave appearing in each of sections shown from FIG. 5 to FIG. 7.

FIG. 6 is a block diagram illustrating an exemplary configuration of a multi phase clock source 6 used in the digital phase locked loop circuit of FIG. 5. FIG. 7 is a block diagram illustrating an exemplary configuration of an input signal time detection section 2 used in the digital phase locked loop circuit of FIG. 5. FIG. 8 illustrates an operational wave appearing in each of sections shown in FIGS. 5 to 7. Operations of a phase difference detection section 3, a frequency control section 4, an output clock generation section 5 are the same as those illustrated in FIG. 1, thereby explanation of those are omitted. As shown in FIG. 6, a multi phase clock source 6 includes a plurality of (e.g. four) steps of differential buffers 101 to 104 serially connected to the other while connected each of respective output buffers 105 to 108.

Each of the differential buffers 101 to 104 is fed back to the first step differential buffer 101 while an output signal of the last step differential buffer 104 is reversed, thereby a ring oscillator is formed. Respective outputs of the differential buffers 101 to 104 are output from the differential buffers 101 to 104 via the output buffers 105 to 108, respectively, as four phase operational clock signals Clk1 to Clk4. These four phase operational clock signals Clk1 to Clk4 include the same frequencies to each other and a prescribe phase difference as shown in FIGS. 8(b) to (e). Although the four differential buffers are employed in this second example, the other number of differential buffers can be connected corresponding to time resolution N (positive integer) as necessary.

Further, although illustration is omitted in the second embodiment, a delay value of the differential buffer can be changed by changing an operation voltage or the like of a differential buffer, accordingly, time resolution T2 can be changed. Thus, the time resolution T2 can be adjusted as necessary. As shown in FIG. 7, an input line of an input signal S1 is commonly connected to a D-terminal of each of four DFFs 201 to 204 in an input signal time detection section 20 as a D-input.

Further, input lines of the operational clock signals Clk1 to Clk4 of the four different phases are connected to CK-terminals as clock signal (CK) inputs, respectively.

Further, a first combination logic 208 receives output signals of the four DFFs 201 to 204 through respective input terminals i1 to i4, converts these output signals into two signals, and outputs those to DFFs 205 and 206 via output terminals o1 and o2, respectively. Respective output signals are input to a second combination logic 209 via the DFFs 205 and 206. Output signals of the DFFs 204 and 207 are also input to the second combination logic 209. The second combination logic 208 receives output signals of DFFs 205 and 206, 204, and 207 through respective input terminals i1 to i2, i3, and i4, converts these four input signals into two output signals, and outputs input signal time data S2.

Due to a relation between phases of the input signal S1 and the four phase operational clock signals Clk1 to Clk4, in the input signal time detection section 2 of FIG. 7, a combination pattern of the output signals of the four DFFs 201 to 204 will become different at the rising edge time of the operational clock signal Clk1. These first and second combination logics 208 and 209 each recognize a N time division phase number at a changing edge of an input signal S1 based on the combination pattern. Operational waves are illustrated in FIGS. 8(f) to (j). Truth-values of the first and second combination logic blocks 208 and 209 are illustrated in the first and second charts, respectively.

Thus, the digital phase locked loop circuit of FIG. 5 having the multi phase clock source 6 and the input signal time detection section 2 can adjust time resolutions N and T2 as necessary by controlling a number of differential buffers used in the multi phase clock source 6 and an operational voltage or the like of the differential buffer. Thus, the digital phase locked loop circuit can increase detection time resolution of a phase of an input signal N times while using an operational clock signal Clk1 having a cycle T1 and a relatively low frequency. Since the input signal time detection section 2 is entirely formed from a digital circuit, it is easy to be mounted on an integrated circuit, and is readily downsized at low cost.

Thus, since the input signal time detection section 2 uses multi phase clock signals (Clk1 to Clkn) having different phases by an amount of a scale of time resolution T2 in a cycle T1, and outputs input signal time data S2 based on phases of the multi phase clock signals and that of the input signal S1, the digital phase locked loop circuit can have high detection time resolution of a phase of an input signal while using an operational clock having a relatively low frequency, and is readily mounted on an integrated circuit. Accordingly, a digital phase locked loop circuit readily mounted on an integrated circuit can be provided with an input signal time detection section having high detection time resolution of a phase of an input signal using an operational clock having a relatively low frequency.

A third exemplary embodiment is now described.

Figure 9:
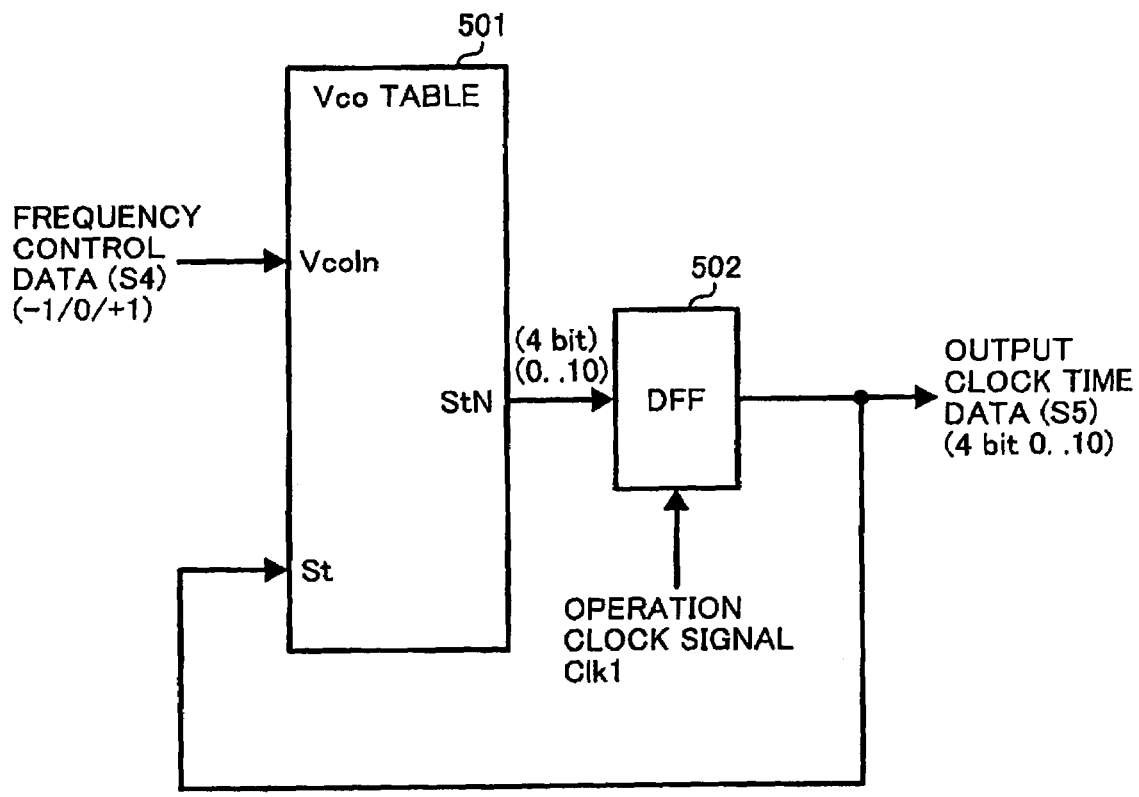
FIG. 9 is a block diagram illustrating an exemplary configuration of an output clock generation section 5 used in a digital phase locked loop circuit of a third embodiment according to present invention.

FIG. 9 is a block diagram illustrating an exemplary configuration of an output clock generation section 5 used in a digital phase locked loop circuit of a third embodiment according to present invention. FIG. 10 illustrates a change of data when the output clock generation section 5 of FIG. 9 operates. According to a digital phase locked loop circuit of this third embodiment, number N is eight (N=8), and thereby time resolution T2 has a time calculated by dividing a cycle T1 of an operational clock signal Clk1 by eight. As shown in FIG. 9, the output clock generation section 5 includes a table 501 and a DFF 502. The table 501 receives an input of the frequency control data S4 and a current state St from the DFF 502 at input terminals Vcoln and St, respectively. The table outputs the next state StN through an output terminal StN based on these inputs signals.

The DFF 502 latches the next state StN output from the table 501 in synchronism with a rising edge of the operational clock signal Clk1, and holds it until receiving that of the next operational clock signal Clk1. Data maintained by the DFF 502 represents a current state, and is output by the DFF 502 as is as output clock time data S5.

The chart illustrates true value of the table 501. In the third embodiment, a value of the frequency control data S4 is supposed to be one of −1, 0, and +1. The third chart illustrates a value of the next state StN determined in accordance with a relation between the current state St and the frequency control data S4.

For example, when a current state St is "2" and frequency control data S4 is "0", the next state StN is "2" as shown on the third line in the third chart.

The fourth chart represents a relation between a current state St, i.e., output clock time data S5, and a phase of a virtual output clock. As shown in the fourth chart, for example, an indication "---" on a line on which a current state St is eight (St=8) represents that an edge of the virtual clock exists at the "8" position among N time division phase numbers (8 to 1) obtained by dividing a cycle of the operational clock signal Clk1 N times into a unit of time resolution T2. Further, an indication "---" on a line on which the current state St is nine (St=9) represents that edges of the virtual clock exist both at the positions of the N time division phase numbers "8" and "1".

Further, an indication "---" on a line on which the current state St is zero (St=0) represents that there is no edges of a virtual clock in a clock cycle. FIG. 10 illustrates a change of data when the output clock generation section 5 of FIG. 9 operates for an amount of thirty three (33) clocks (clock cycle numbers 0 to 32) with a cycle of an operational clock signal Clk1. As shown in the drawing, since one line can not entirely describe information, description is divided into five lines of from (a) to (e). Among the thirty-three clocks, a value of frequency control data S4 is "−1" when clock cycle numbers are from 0 to 12. The state St changes in accordance with the truth value described in the third chart as, 0, 8, 7, 6, 5, 4, 3, 2, 1, 0, and 8, and so on.

This value as is represents a virtual output clock phase. A phase of the virtual output clock deviates backward by one N time division phase number per one cycle of the operational clock signal Clk1 during when the frequency control data S4 is "−1". Specifically, a cycle of the virtual output clock is calculated as 9×T2. Further, a value of the frequency control data S4 amounts to zero and the state St maintains "5" when the clock cycle numbers are from "13 to 20". Accordingly, an edge phase of the virtual output clock remains at the position of the N time division phase number "5", and a cycle of the virtual output clock is calculated as 8×T2.

A value of the frequency control data S4 amounts to +1 in the clock cycle numbers "21" to "32". Further, the value of the state St changes as 5, 6, 9, 9, 2, 3, 4, 5, 6, 7, and 9, and so on When the state St is nine (St=9), there are two virtual output clock edges.

Thus, when the frequency control data S4 is +1, a phase of the virtual output clock deviates forwardly by one N time division phase number per cycle of the operational clock signal Clk1. Specifically, a cycle of the virtual output clock is calculated as 7×T2. As mentioned previously, the output clock generation section 5 of FIG. 9 can change a cycle of the virtual output clock in a unit of T2 serving as time resolution, which is N times of the cycle T1 of the operational clock signal Clk1, in accordance with a value of the frequency control data S4. Specifically, the output clock generation section 5 of FIG. 9 included in the digital phase locked loop circuit of the third embodiment can increase time resolution of the virtual output clock phase N times while using an operational clock signal Clk1 having a relatively low frequency.

Thus, fine time resolution of an output clock phase can be realized while using an operational clock having a relatively low frequency. Because, the output clock generation section 5 operates with a clock having a cycle T1 and functions as a state machine having a state (S5/St) corresponding to a virtual output clock phase. Further because, the output clock generation section 5 determines the next state StN based on a relation between a frequency control data S4 and a current state St, and outputs a value corresponding to the determined state as output clock time data S5. Accordingly, a digital phase locked loop circuit having an output clock generation section that generates a virtual output clock having fine time resolution phase can be realized while using an operational clock having a relatively low frequency.

A fourth exemplary embodiment is now described.

Figure 11:
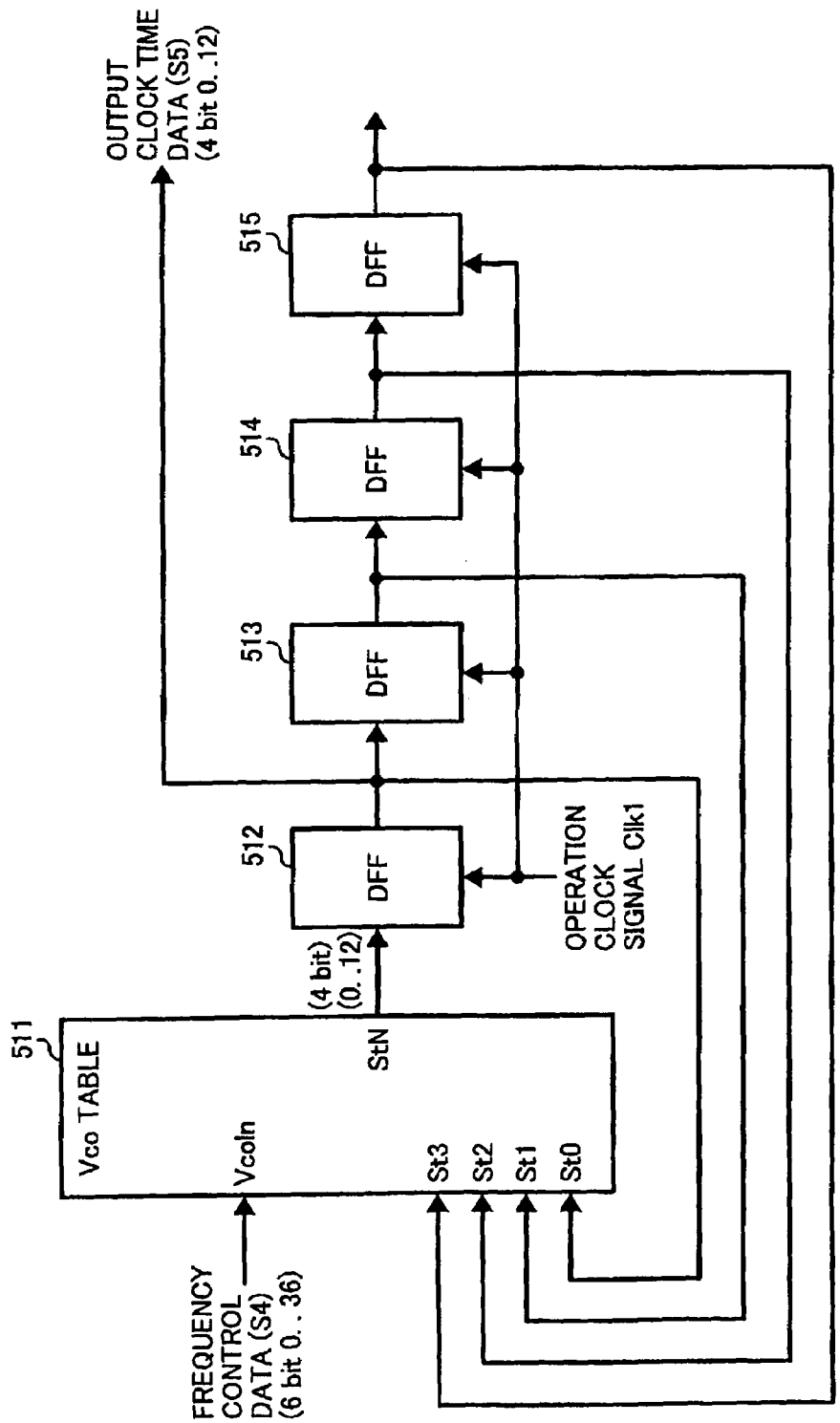
FIG. 11 is a block diagram illustrating an exemplary configuration of an output clock generation section 5 used in a digital phase locked loop circuit of a fourth embodiment according to present invention.

FIG. 11 is a block diagram illustrating an exemplary configuration of an output clock generation section 5 used in a digital phase locked loop circuit of a fourth embodiment according to present invention. FIG. 12 illustrates a change of data when the output clock generation section 5 of FIG. 11 operates. In a digital phase locked loop circuit of this fourth embodiment, N is 12 (N=12), and the time resolution T2 has a time calculated by dividing a cycle T1 of an operational clock signal Clk1 by twelve. As shown in FIG. 11, the output clock generation section 5 includes a table 511 and four DFFs 512 to 515.

The table 511 receives an input of frequency control data S4 at an input terminal Vcoln. The table 511 also receives inputs of current states St0, St1, St2, St3, and St4 from the DFFs 512, 513, 514, and 515 at input terminals St0, St1, St2, and St3, respectively. The table 511 then outputs the next state StN through the output terminal StN based on the input signals from the four DFFs 512 to 515. The DFF 512 latches the next state StN output from the table 511 in synchronism with a rising edge of the operational clock signal Clk1, and maintains it until a rising edge of the next operational clock signal Clk1.

Data held by the DFF 512 represents a current state and is output from the DFF 512 as output clock time data S5. Since the four DFFs 512 to 515 are connected in a shift register state, and the data held by the DFF 512 represents current state, the following DFFs 513 to 515 hold past states of three clocks. Specifically, the table 511 outputs the next state StN based on the frequency control data S4, the current state St0, and the past states St1, St2, and St3 of the three clocks. The fifth chart illustrates true-value of the table 511.

It is supposed in the fourth embodiment that a value of the frequency control data S4 varies from zero to "36". Fifth to ninth charts illustrate values of the next states StN determined based on a relation between frequency data S4, the current state St, and the past states St1, St2, and St3. True-value practically has significantly a large value, the fifth to ninth charts illustrate only cases when frequency control data S4 are 0, 1, 2, 35, and 36. Specifically, cases when the frequency control data S4 are 3, 4, . . . , and 34 are omitted. As understood from a regularity from the fifth to ninth charts, every time when frequency control data S4 increases by one, a content of the state StN is upwardly shifted by one line. Further, the same regularity appears in the cases when the frequency control data S4 are 3, 4, . . . , and 34.

A tenth chart illustrates a relation between a current state St0, i.e., output clock time data S5, and a virtual output clock phase. As shown in the tenth chart, an indication "---" on a line indicating that a current state St0 is twelve (St0=12) represents that there exists an edge of a virtual clock at position of the N time division phase number "12" among those "12 down to 1", which is obtained by dividing a cycle of an operational clock signal Cklk1 by N (twelve) into a unit of time resolution T2, for example. Further, an indication "---" on a line indicating that the current state St0 is zero (St0=0) represents that there exists no edges of a virtual clock in such a clock cycle.

FIGS. 12 to 14 illustrate a change of data when the output clock generation section 5 of FIG. 11 operates on a condition that a frequency control data S4 vary from 23 to 25. As shown in the drawing, since one line can not entirely describe information, description is divided into five lines of from (a) to (e). As shown in FIG. 12, a state St0 changes to be 0, 12, 0, 11, 0, 10, 0, 9, 0, 8, 0, and 7, etc., in accordance with true-value of the fifth chart when frequency control data S4 is 23 (S4=23).

The value as is represents a virtual output clock phase. When frequency control data S4 is twenty-three (S=23), a virtual output clock is generated almost once per two cycles of the operational clock signal Clk1. The phase deviates afterwards by one N time division phase number per cycle of the operational clock signal Clk1. Specifically, a cycle of the virtual output clock is calculated as 25×T2. As shown in FIG. 13, a state St0 changes to be 0, 12, 0, 12, 0, and 12, etc., in accordance with the true-value of the fifth chart when frequency control data S4 is 24 (S4=24).

The value as is represents a virtual output clock phase. When frequency control data S4 is twenty-four (S4=24), a virtual output clock is generated almost once per two cycles of the operational clock signal Clk1, and a phase thereof always exists at the same N time division phase number position.

Specifically, a cycle of the virtual output clock is calculated as 24×T2. As shown in FIG. 14, a state St0 changes to be 0, 12, 1, 0, 2, 0, 3, 0, 4, 0, 5, and 0, etc., in accordance with the true-value of the fifth chart when frequency control data S4 is 25 (S4=25). The value as is represents a virtual output clock phase. When frequency control data S4 is twenty-five (S4=25), a virtual output clock is generated almost once per two cycles of the operational clock signal Clk1, and a phase thereof deviates forward by one N time division phase number per cycle of the operational clock signal Clk1. Specifically, a cycle of the virtual output clock is calculated as 23×T2.

FIG. 15 illustrates a change of data when the output clock generation section 5 of FIG. 11 operates on a condition that the frequency control data S4 is the least "0".

FIG. 16 also illustrates a change of data when the output clock generation section 5 of FIG. 11 operates on a condition that the frequency control data S4 is the maximum "36". As shown in the drawings, since one line can not entirely describe information, description is divided into two lines of (a) and (b). As shown in FIG. 15, a state St0 changes to be 0, 12, 0, 0, 0, 12, 0, 0, 0, and 12, etc., in accordance with the true-value of the fifth chart when the frequency control data S4 is 0 (S4=0).

The value as is represents a virtual output clock phase. Specifically, when the frequency control data S4 is zero (S4=0), a virtual output clock is generated almost once per four cycles of the operational clock signal Clk1, and a phase thereof always exists at the same N time division phase number position. Specifically, a cycle of the virtual output clock is calculated as 48×T2. As shown in FIG. 16, the state St0 changes to be 0, 12, 12, 12, 12, 12, and 12, etc., in accordance with the true-value of fifth chart when the frequency control data S4 is 36 (S4=36). The value as is represents a virtual output clock phase. When frequency control data S4 is thirty-six (S4=36), a virtual output clock is generated almost once per cycle of the operational clock signal Clk1, and a phase thereof always exists at the same N time division phase number position.

Specifically, a cycle of the virtual output clock is calculated as 12×T2. As mentioned heretofore, the output clock generation section 5 of FIG. 11 can change a cycle of the virtual output clock into a unit of T2, that realizes N times of the time resolution of the operational clock signal Clk1 with the cycle T1, in accordance with a value of frequency control data S4. Further, an operation frequency of the output clock widely increases from "12×T2" to "48×T2" when converted into a clock cycle in comparison with the output clock generation section 5 of FIG. 9. Specifically, the output clock generation section 5 included in the digital phase locked loop circuit of the fourth embodiment can increase time resolution of a virtual output clock phase N times while using an operational clock signal Clk1 having a relatively low frequency. Further, a range of an operation frequency of the output clock can be expanded.

Thus, the output clock generation section 5 can provide fine time resolution of an output clock phase having a wide operation frequency range of an output clock while using an operational clock having a relatively low frequency. Because, the output clock generation section 5 operates with a clock having a cycle T1 and functions as a state machine having a state (S5/St0) corresponding to a virtual output clock phase, and includes a plurality of DFFs 513 to 515 to store one or more past states.

Further because, the output clock generation section 5 determines the next state StN based on a relation between frequency control data S4 and one or more past states St1 to St3, and outputs a value as output clock time data S5 corresponding to thus determined state. Accordingly, a digital phase locked loop circuit including an output clock generation section realizing fine time resolution of an output clock phase with a wide operation frequency range of an output clock can be realized while using an operational clock having a relatively low frequency.

A fifth exemplary embodiment is now described.

Figure 17:
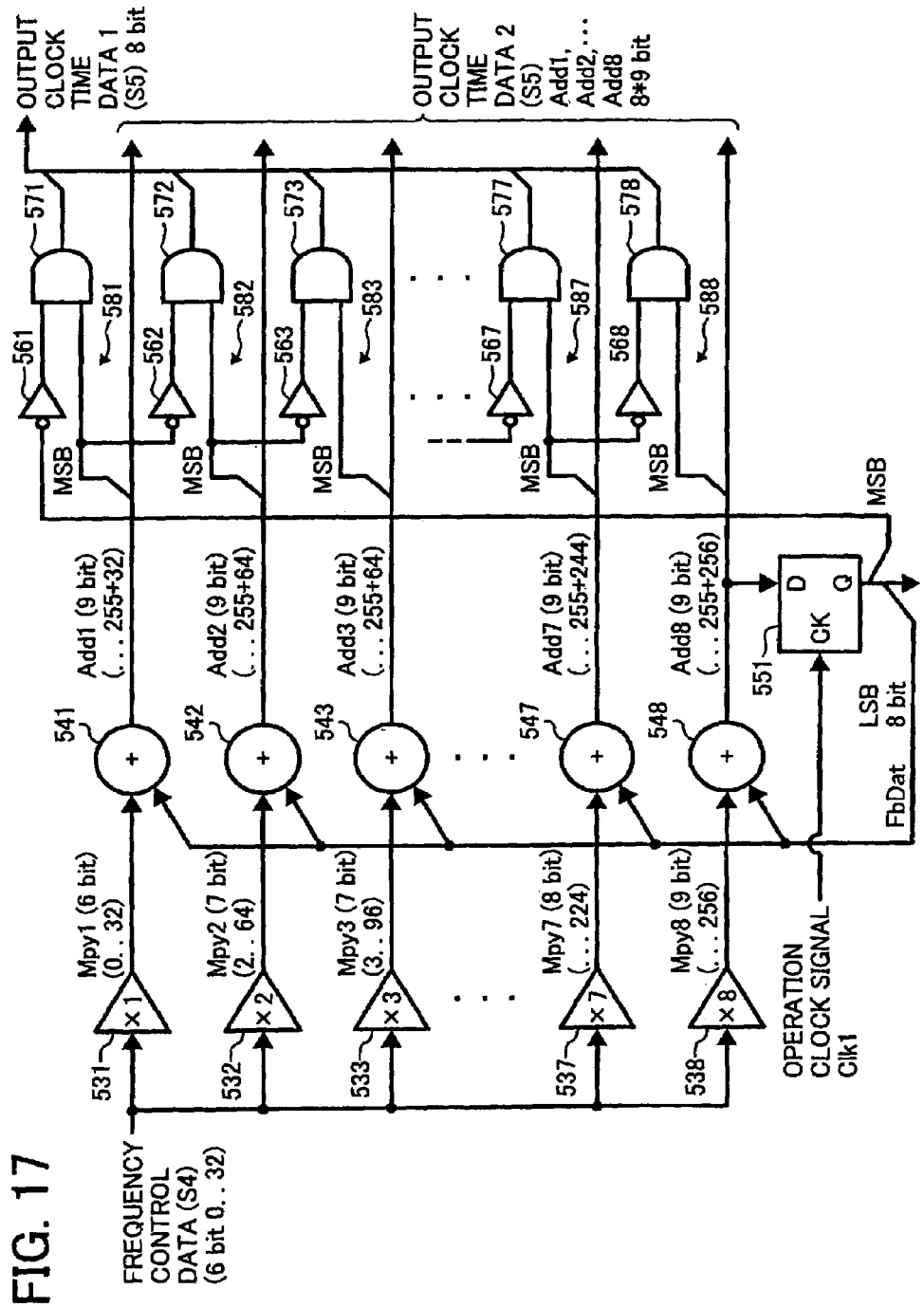
FIG. 17 is a block diagram illustrating an exemplary configuration of an output clock generation section 5 used in a digital phase locked loop circuit of a fifth embodiment according to present invention.
Figure 25:
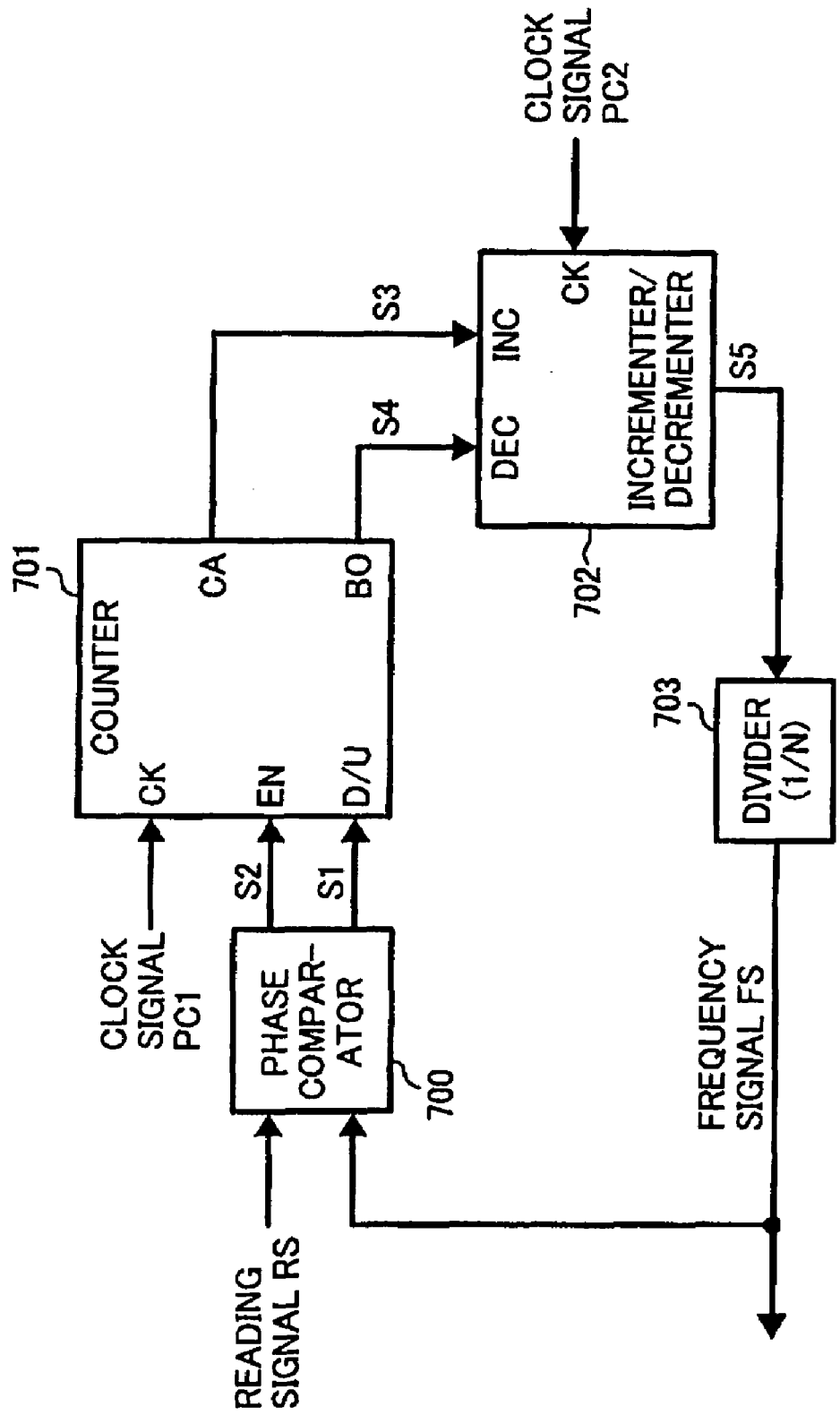
FIG. 25 is a block diagram illustrating an exemplary configuration of a conventional digital phase locked loop circuit.
Figures 26, 27, 28:
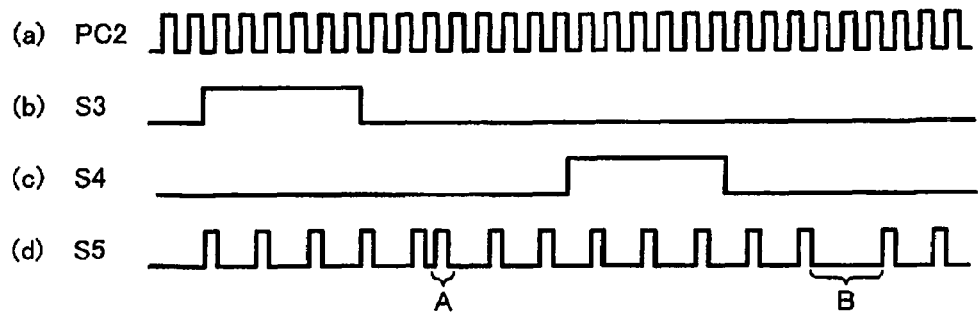

FIG. 17 is a block diagram illustrating an exemplary configuration of an output clock generation section 5 used in a digital phase locked loop circuit of a fifth embodiment according to present invention. FIG. 18 illustrates a change of data when the output clock generation section 5 of FIG. 17 operates. In a digital phase locked loop circuit of this illustrated embodiment, N is 8 (N=8), and accordingly time resolution T2 has a time calculated by dividing the cycle T1 of the operational clock signal Clk1 by 8. Further, frequency control data S4 ranges from 1 to 32 in the fifth embodiment.

As shown in FIG. 17, the output clock generation section 5 includes eight multipliers 531 to 538 (Nos. 534 to 536 are omitted in the drawing). These multipliers 531 to 538 multiply numbers 1 to 8 and frequency control data S4 so as to obtain eight data of Mpy1 to Mpy8, respectively. Further, eight adders 541 to 548 (Nos. 544 to 546 are omitted in the drawing) are provided so that lower eight bit values FbDat among outputs of the DFF 551 can be added to the respective data of Mpy1 to Mpy8 to obtain eight data of Add1 to Add8. A D-input to an input terminal D of the DDF 551 is the output value Add8 of the adder 548. Further, an operational clock signal Clk1 is a clock input to the input terminal CK of the DFF 551.

Only MSB (top bit) is drawn among the data from each of the adders Add1 to Add8, and is input to respective gate circuits 581 to 588. The gate circuits 581 to 588 (Nos. 584 to 586 are omitted in the drawing)) include NOT circuits 561 to 568 (Nos. 564 to 566 are omitted in the drawing) and AND gates 571 to 578 (Nos. 574 to 576 are omitted in the drawing), respectively. Each of outputs of the AND gates 571 to 578 becomes "1" when each of the MSBs is "1" and a MSB upper by one in the drawing is "0". An output of the AND gate 571 becomes "1" when the MSB of the Add1 is "1" and a MSB as an output of the DFF 551 is "0".

An 8 bit data formed by integrating the outputs of these eight AND gates 571 to 578 is output as output clock time data1 (S5). In this fifth embodiment, a virtual output clock phase is represented by a bit position where the output clock time data1 (S5) becomes "1". FIGS. 18 to 20 collectively illustrate a change of data when the output clock generation section 5 of FIG. 17 operates on a condition that frequency control data S4 is "15", "16", or "17". In each of the respective drawings, data of each section in the circuit is represented in one line per cycle of an operational clock signal Clk1, wherein a line descending direction represents a time elapsing direction. Further, initial data of the DFF 551 has "64" in this embodiment.

Now, data change during an operation in the output clock generation section 5 of FIG. 17 is partially described. For example, the eight data Mpy1, Mpy2, . . . , and Mpy8 on the line of the clock cycle number "1" in FIG. 18 become values "15", "30", . . . , and "120", because, "1", "2", . . . , and "8" and the frequency control data "15" are multiplied. Since the value of the Add 8 is "184" in the previous clock cycle, FbDat is also "184". The data of Add1 to Add8 become "199", "214", . . . , and "304" through calculation of adding FbDat to the respective eight data of the Mpy1 to Mpy8.

MSBs of the Add1 to Add8 are extracted, respectively. A condition if a MSB is "1" and a MSB upper by one in the drawing is "0" is detected. A condition where the Add4 is "244" (MSB=0) and Add5 is "259" (MSB=1) meets the above-mentioned condition. Thus, the fifth bit in the output clock time data becomes "1" and represents that an edge phase of the virtual output clock exists at this position. A smaller bit number in the output clock time data1 illustrated in FIGS. 18 to 22 represents an earlier time in contrast to the N time division phase number as described heretofore.

Specifically, it represents that when the bit number1 is "1", an edge phase of the virtual output clock exists at the position of the N time division phase number "8".

Further, when a bit number8 is "1", an edge phase of the virtual output clock exists at the position of the N time division phase number "1". When frequency control data S4 is sixteen (S4=16) as illustrated in FIG. 19, a virtual output clock is always generated once per two cycles of the operational clock signal Clk1 at the same position of the N time division phase number. In contrast, when frequency control data S4 is fifteen (S4=15) as illustrated in FIG. 18, a virtual output clock is generated almost once per two cycles of the operational clock signal Clk1, and the phase gradually deviates afterwards. Specifically, a frequency of a virtual output clock decreases when the frequency control data S4 is "15" (S4=15) than when the frequency control data S4 is "16" (S4=16).

Further, although a virtual output clock is generated almost once per two cycles of the operational clock signal Clk1, the phase gradually deviates forward when the frequency control data S4 is "17" (S4=17). Specifically, a frequency of a virtual output clock is higher when the frequency control data S4 is "17" (S4=17) than when the frequency control data S4 is "16" (S4=16). FIGS. 21 and 22 illustrate a change of data when the output clock generation section 5 of FIG. 17 operates on a condition where frequency control data S4 is "8" or "32". As understood when the frequency control data (S4=16) is referred to, edges of virtual output clocks are generated in every four, two, and one cycle when frequency control data S4 is 8, 16, or 32, respectively.

Specifically, the output clock generation section 5 of FIG. 17 can obtain a virtual output clock frequency almost in proportion to a value of the frequency control data S4 input thereto. Further, a gain performance of the output clock generation section 5 of FIG. 17 is constant, a gain of the digital phase locked loop circuit can be maintained to be constant regardless of an operation frequency. Thus, it provides an advantage that a pull-in time of the digital phase locked loop circuit is stable. As mentioned heretofore, the output clock generation section 5 of FIG. 17 can obtain excellent gain linearity. Because, the output clock generation section 5 can increase time resolution of a phase of a virtual output clock N-times while using an operational clock signal Clk1 having a cycle T1 and a relatively lower frequency, as well as be able to expand a range of an operation frequency of an output clock.

In other words, the output clock generation section 5 can obtain fine time resolution of a phase of an output clock while using an operational clock having a relatively low frequency, and a wide range operation frequency of an output clock, as well as a excellent gain linearity. Because, the output clock generation section 5 includes the N items of the multipliers 531 to 538 that multiply values of 1 to N and the frequency control data S4, the DFF 551 that stores data input per operational clock having a cycle T1 as a storage device, and the N items of the adders 541 to 548 that add data stored in the DFF551 to outputs from the N items of the multipliers 531 to 538, respectively. Further because, the DFF 55 receives an output of one adder 548 among N items of the adders 541 to 548 as input data thereto, and outputs output clock time data S5 in accordance with outputs of the N items of the adders 514 to 548. Accordingly, a digital phase locked loop circuit having an output clock generation section 5 that realizes fine time resolution of a phase of a output clock using an operational clock having a relatively low frequency, while having a wide range operation frequency of an output clock and a excellent gain linearity can be realized A sixth exemplary embodiment is now described.

FIG. 23 is a block diagram illustrating an exemplary configuration of a phase difference detection section 3 used in a digital phase locked loop circuit of a sixth embodiment according to present invention. FIG. 24 is a wave of an output signal of each of sections when the phase difference detection section 3 of FIG. 23 operates.

A phase difference detection section 3 of FIG. 23 receives an input of input signal time data S2 and output signals Add1 to Add8 serving as output clock time data2 (S5) from the input signal time detection section 2 and the N items of adders 514 to 548 included in the output clock generation section 5 of FIG. 17, respectively.

Each LSB (8 bit) in the Add1 to Add 8 is input to a DFF 301. The DFF 301 delays input data by an amount of a cycle of an operational clock signal Clk1 and outputs data DAdd1 to DAdd8, respectively. These eight delay data DAdd1 to DAdd8 are input to a selector (SEL in the drawing) 302, and one of them is selectively output as selection data SAdd in accordance with the input signal time data S2. A subtracter (SUB in the drawing) 303 subtracts a value of the SAdd from fixed data "128" and is output as a phase difference signal S3.

As shown in FIG. 24, output clock time data2 (S5=Add1 to Add8) input from the output clock generation section 5 corresponds to the operating data in FIG. 19. In the drawing, three cases are represented on one operational wave, in which a phase of an input signal S1 is differently positioned. Specifically, a changing edge of the input signal S1 appears at N time division phase numbers "7", "5", and "2" of the clock cycle number "2" in these first to third cases. Similar to the data change during an operation as mentioned with reference to FIG. 19, an edge phase of a virtual output clock exists at positions of N time division phase numbers "5" of the clock cycle number "1", and N time division phase numbers "5" of the clock cycle number "3" as shown in FIG. 24.

When the clock cycle number is "2" in which a change edge appears in an input signal S1, output signals Add1 to Add8 have "80", "96", "112", "128", "144", "160", "176", and "192" values, respectively. Data DAdd1 to DAdd8 are delayed from these signals by one operational clock, and these data can be obtained when the clock cycle number is "3". Data SAdd is selected from these data in accordance with a value of the input signal time data S2. Specifically, DAdd1 to DAdd8 are selected when the input signal time data (S2) is "8", "7", . . . , and "1", respectively.

Since S2 is eight (S2=8) in the first case, data DAdd=80 is selected. Since S2 is five (S2=5) in the second case, data DAdd=128 is selected. Since S2 is two (S2=2) in the third case, data DAdd=176 is selected. These values are subtracted from the fixed data "128", and "+48", "0", and "−48" are obtained and output as a phase difference signal S3 in the first to third cases, respectively. In the second case, a changing edge of the input signal S1 appears right in the middle of the former and latter virtual clock edge phases. This situation represents that a phase difference is nothing (0), and a phase difference signal S3 is zero. The first case represents that a changing edge phase of the input signal S1 is advanced from when the phase difference is nothing (0), and accordingly, a phase difference signal S3 has a positive value.

The third case represents that a changing edge phase of the input signal S1 is delayed from the condition when the phase difference is nothing (0), and accordingly, a phase difference signal S3 has a negative value. As understood from the above-mentioned description, a difference in a changing edge phase of the input signal S1 between the first and second cases or the second and third cases is smaller than a cycle T1 of the operational clock Clk1 when a phase difference of the second case is nothing. Specifically, the phase difference includes only three scales of the time resolution T2 divided N times. However, the phase difference detection section 3 of FIG. 23 provides 48 different values in a phase difference signal S3. Specifically, the phase difference signal S3 obtained by the phase difference detection section 3 of FIG. 23 has significantly high phase difference detection resolution.

As mentioned heretofore, the phase difference detection section 3 of FIG. 23 can detect a phase difference between the input signal and the virtual output clock with high detection time resolution while using an operational clock having a relatively low frequency. Thus, the phase difference detection section 3 can achieve fine detection time resolution of a phase difference between input and output signals while using an operational clock having a relatively low frequency. Because, the phase difference detection section 3 selects an output signal of one of the N items of adders among output clock time data2 (S5) including output signals Add1 to Add8 in accordance with input signal time detection data S2, and detects a phase difference based on the selection output value. Specifically, a digital phase locked loop circuit having the phase difference detection section 3 capable of detecting a phase difference between the input and output signals with high detection time resolution can be realized while using an operational clock having a relatively low frequency.

The phase locked loop apparatus of the present invention can also be employed in an optical disc apparatus including a CD-drive, and a DVD drive, as well as a magnetic disc apparatus including a MO drive.

Numerous additional modifications and variations of the present invention are possible in light of the above teachings. It is therefore to be understood that within the scope of the appended claims, the present invention may be practiced otherwise that as specifically described herein.

What is claimed as new and desired to be protected by Letters Patent of the United States is:

1. A digital phase locked loop apparatus, comprising:
    an operation clock generator that generates and outputs operation clocks at a prescribed frequency, characterized in that the apparatus comprises:
        an input signal input time detecting device that receives an input signal and the operation clock and configured to detect a number assigned to a segmented phase of the operation clock at an edge of the input signal, said segmented phase having prescribed time resolution obtained by dividing a cycle of the operation clock by a prescribed number, said input signal time detecting device outputting input signal input time data including the number assigned to the segmented phase detected by the input signal input time detecting device.

2. A digital phase locked loop apparatus, comprising:
    an output clock time data generating device that receives frequency control data and an operation clock and configured to determine a phase of a virtual output clock based on the frequency control data and to output output clock time data, said output clock time data having a number assigned to a segmented phase of the operation clock at an edge of the virtual output clock, said segmented phase having a time resolution obtained by dividing the operation clock by a prescribed number.

3. A digital phase locked loop apparatus of comprising:
    an operation clock generator that generates and outputs operation clocks at a prescribed frequency, characterized in that the apparatus comprises:
        an input signal input time detecting device that receives an input signal and the operation clock and configured to detect a number assigned to a segmented phase of the operation clock at an edge of the input signal, said segmented phase having prescribed time resolution obtained by dividing a cycle of the operation clock by a prescribed number, said input signal time detecting device outputting input signal input time data including the number assigned to the segmented phase detected by the input signal input time detecting device; and
    an output clock time data generating device that receives frequency control data and the operation clock and configured to determine a phase of a virtual output clock based on the frequency control data and to output output clock time data, said output clock time data having a number assigned to a segmented phase of the operation clock at an edge of the virtual output clock, said segmented phase having the time resolution obtained by dividing the operation clock by the prescribed number.

4. The digital phase locked loop apparatus of claim 3, further comprising:
    a phase difference detecting device that receives the input signal input time data and the virtual output clock time data and configured to detect a difference between the numbers assigned to the segmented phases of the input signal and the virtual output clock, said phase difference detecting device outputting a phase difference signal in accordance with the detection result.

5. The digital phase locked loop apparatus of claim 4, further comprising:
    a frequency control device that receives the phase difference signal and configured to change and output the frequency control data to the output clock time data generating device in accordance with the phase difference signal.

* * * * *